US012751085B2

(12) United States Patent
Dong et al.

(10) Patent No.: US 12,751,085 B2
(45) Date of Patent: Sep. 29, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Xiangdan Dong, Beijing (CN); Cong Fan, Beijing (CN); Kemeng Tong, Beijing (CN); Yao Huang, Beijing (CN); Chunyan Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 369 days.

(21) Appl. No.: 18/690,515

(22) PCT Filed: Mar. 14, 2023

(86) PCT No.: PCT/CN2023/081342

§ 371 (c)(1),
(2) Date: Mar. 8, 2024

(87) PCT Pub. No.: WO2024/187374

PCT Pub. Date: Sep. 19, 2024

(65) Prior Publication Data

US 2025/0234650 A1 Jul. 17, 2025

(51) Int. Cl.

*H10D 86/40* (2025.01)
*H10W 42/60* (2026.01)
*G09G 3/3233* (2016.01)

(52) U.S. Cl.

CPC .......... *H10D 86/443* (2025.01); *H10W 42/60* (2026.01); *G09G 3/3233* (2013.01); (Continued)

(58) Field of Classification Search

CPC ....... G09G 2310/08; G09G 2300/0426; G09G 2310/0262; G09G 2310/0267
See application file for complete search history.

(56) References Cited

U.S. PATENT DOCUMENTS

| | | | | |
|---|---|---|---|---|
| 10,910,410 B2 * | 2/2021 | Zhu | ........................ | H10D 86/60 |
| 2017/0287394 A1 * | 10/2017 | Kim | ..................... | H10K 59/131 |

(Continued)

*Primary Examiner* — Thao P Le

(74) *Attorney, Agent, or Firm* — Intellectual Valley Law, P.C.

(57) ABSTRACT

An array substrate includes a display area and a notch area. The display area includes a first display sub-area and a second display sub-area spaced apart from each other by the notch area. The notch area includes an electrostatic discharge area. The array substrate includes a plurality of data lines and a plurality of scan signal lines. The plurality of data lines at least partially extend into the electrostatic discharge area. The plurality of scan signal lines cross over the electrostatic discharge area. At least a portion of the electrostatic discharge area includes a plurality of first sub-regions and a plurality of second sub-regions alternately arranged. The plurality of scan signal lines are present in the plurality of first sub-regions, and absent in the plurality of second sub-regions. The plurality of data lines are present in the plurality of second sub-regions, and absent in the plurality of first sub-regions.

20 Claims, 31 Drawing Sheets

(52) U.S. Cl.
CPC ............... *G09G 2300/0819* (2013.01); *G09G 2300/0842* (2013.01); *G09G 2300/0861* (2013.01); *G09G 2310/08* (2013.01)

(56) References Cited

U.S. PATENT DOCUMENTS

| | | | | |
|---|---|---|---|---|
| 2019/0019467 | A1* | 1/2019 | Kim | G09G 3/3677 |
| 2019/0043414 | A1* | 2/2019 | Wu | G09G 3/2092 |
| 2019/0129258 | A1* | 5/2019 | Liu | G02F 1/13338 |
| 2019/0304999 | A1* | 10/2019 | Wang | H10D 86/60 |
| 2021/0199727 | A1* | 7/2021 | Xu | G01R 31/56 |
| 2021/0255515 | A1* | 8/2021 | Ko | G02F 1/136227 |
| 2023/0142681 | A1* | 5/2023 | Cho | H10K 59/121<br>345/174 |
| 2023/0186843 | A1* | 6/2023 | Wang | G11C 19/28<br>345/55 |
| 2025/0089370 | A1* | 3/2025 | Wang | G09F 9/30 |
| 2025/0212629 | A1* | 6/2025 | Cai | H10D 89/00 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/081342, filed Mar. 14, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, an embodiment of the present disclosure provides an array substrate, comprising a display area and a notch area; wherein the display area comprises a first display sub-area and a second display sub-area spaced apart from each other by the notch area; wherein the notch area comprises an electrostatic discharge area; wherein the array substrate comprises a plurality of data lines and a plurality of scan signal lines; the plurality of data lines at least partially extend into the electrostatic discharge area; and the plurality of scan signal lines cross over the electrostatic discharge area; wherein at least a portion of the electrostatic discharge area comprises a plurality of first sub-regions and a plurality of second sub-regions alternately arranged; the plurality of scan signal lines are present in the plurality of first sub-regions, and absent in the plurality of second sub-regions; and the plurality of data lines are present in the plurality of second sub-regions, and absent in the plurality of first sub-regions.

In some embodiments of the present disclosure, scan signal lines, which extend from the first display sub-area and cross over a portion of the electrostatic discharge area adjacent to the first display sub-area, are connected with scan signal lines, which extend from the second display sub-area and cross over a portion of the electrostatic discharge area adjacent to the second display sub-area.

In some embodiments of the present disclosure, a respective first sub-region of the plurality of first sub-regions comprises multiple scan signal lines of the plurality of scan signal lines; and a respective second sub-region of the plurality of second sub-regions comprises at least one data line.

In some embodiments of the present disclosure, the electrostatic discharge area comprises a plurality of electrostatic discharge units for protecting a plurality of data lines.

In some embodiments of the present disclosure, the electrostatic discharge area further comprises a plurality of dummy electrostatic discharge units; the plurality of electrostatic discharge units are present in the plurality of second sub-regions, and absent in the plurality of first sub-regions; and the plurality of dummy electrostatic discharge units are present in the plurality of first sub-regions, and absent in the plurality of second sub-regions.

In some embodiments of the present disclosure, an orthographic projection of an individual scan signal line of the plurality of scan signal lines in an individual first sub-region of the plurality of first sub-regions on a base substrate partially overlaps with an orthographic projection of multiple dummy electrostatic discharge units of the plurality of dummy electrostatic discharge units on the base substrate.

In some embodiments of the present disclosure, the notch area further comprises a transition area between the electrostatic discharge area and the first display sub-area or between the electrostatic discharge area and the second display sub-area; the transition area is absent of electrostatic discharge units; in the transition area, the plurality of data lines and the plurality of scan signal lines cross over each other; portions of the plurality of scan signal lines that cross over the plurality of data lines respectively extend along a first direction; portions of the plurality of data lines that cross over the plurality of scan signal lines respectively extend along a second direction; and the first direction and the second direction are substantially perpendicular to each other.

In some embodiments of the present disclosure, multiple scan signal lines from a same row of subpixels cross over a same number of data lines.

In some embodiments of the present disclosure, the portions of the plurality of data lines that cross over the plurality of scan signal lines are in a first signal line layer; and the portions of the plurality of scan signal lines that cross over the plurality of data lines are in a second signal line layer on side of the first signal line layer away from a base substrate.

In some embodiments of the present disclosure, a respective scan signal line of the plurality of scan signal lines that cross over a transition area and the electrostatic discharge area includes a first portion, a second portion, and a third portion; the first portion crosses over one or more data lines in the transition area; the second portion crosses over the electrostatic discharge area; the third portion is at least partially in a portion of the notch area on a side of the electrostatic discharge area away from the transition area; and the second portion connects the first portion with the third portion.

In some embodiments of the present disclosure, the first portion is in a layer different from the second portion.

In some embodiments of the present disclosure, the first portion is in a first conductive layer; and the second portion is in a first signal line layer on a side of the first conductive layer away from a base substrate.

In some embodiments of the present disclosure, the respective scan signal line of the plurality of scan signal lines that cross over the transition area and the electrostatic discharge area further comprises a fourth portion at least partially in the display area; the first portion connects the fourth portion with the second portion; the first portion is in a first conductive layer; and the fourth portion is in a first signal line layer on a side of the first conductive layer away from a base substrate.

In some embodiments of the present disclosure, the second portion and the fourth portion are in a same layer as the plurality of data lines.

In some embodiments of the present disclosure, the second portion and the third portion of the respective scan signal line of the plurality of scan signal lines that cross over the transition area and the electrostatic discharge area are in different layers.

In some embodiments of the present disclosure, second portions of multiple scan signal lines of the plurality of scan signal lines in a same first sub-region of the plurality of first sub-regions are connected to third portions of the multiple scan signal lines; the second portions of the multiple scan signal lines are in a first conductive layer; and the third portions of the multiple scan signal lines are alternately in the first conductive layer and a second conductive layer, the second conductive layer being on a side of the first conductive layer away from a base substrate.

In some embodiments of the present disclosure, second portions of multiple scan signal lines of the plurality of scan signal lines in a same first sub-region of the plurality of first sub-regions are connected to first portions of the multiple scan signal lines; and the first portions of the multiple scan signal lines are alternately in a first conductive layer and a second signal line layer, the second signal line layer being on a side of the first conductive layer away from a base substrate.

In some embodiments of the present disclosure, an individual second portion in the second signal line layer is connected to an individual first portion in the second signal line layer; and an individual second portion in the first signal line layer is connected to an individual first portion in the first conductive layer.

In some embodiments of the present disclosure, second portions of multiple scan signal lines of the plurality of scan signal lines in a same first sub-region of the plurality of first sub-regions are connected to third portions of the multiple scan signal lines; the third portions of the multiple scan signal lines are alternately in the first conductive layer and a second conductive layer, the second conductive layer being on a side of the first conductive layer away from a base substrate; an individual second portion in the second signal line layer is connected to an individual third portion in the first conductive layer; and an individual second portion in the first signal line layer is connected to an individual third portion in the second conductive layer.

In one aspect, an embodiment of the present disclosure provides a display apparatus, comprising the array substrate, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a display area and a notch area. Optionally, the display area includes a first display sub-area and a second display sub-area spaced apart from each other by the notch area. Optionally, the notch area includes an electrostatic discharge area. Optionally, the array substrate includes the plurality of data lines and a plurality of scan signal lines. Optionally, the plurality of data lines at least partially extend into the electrostatic discharge area. Optionally, the plurality of scan signal lines cross over the electrostatic discharge area. Optionally, at least a portion of the electrostatic discharge area comprises a plurality of first sub-regions and a plurality of second sub-regions alternately arranged. Optionally, the plurality of scan signal lines are present in the plurality of first sub-regions, and absent in the plurality of second sub-regions. Optionally, the plurality of data lines are present in the plurality of second sub-regions, and absent in the plurality of first sub-regions.

Figure 1:
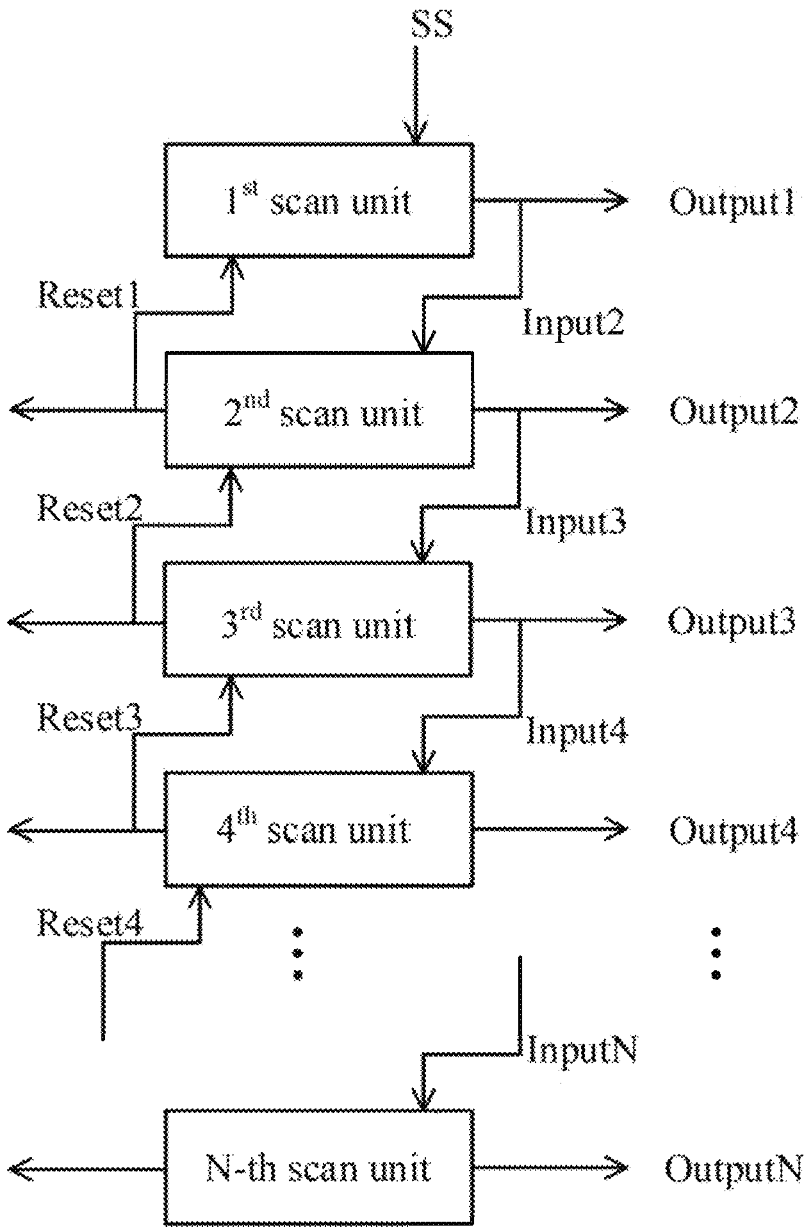
FIG. 1 is a schematic diagram illustrating the structure of a scan circuit in some embodiments according to the present disclosure.

FIG. 1 is a schematic diagram illustrating the structure of a scan circuit in some embodiments according to the present disclosure. Referring to FIG. 1, the scan circuit in some embodiments includes N number of stages. A respective stage of the N number of stages includes a respective scan unit. As depicted in FIG. 1A, the scan circuit includes a $1^{st}$ scan unit, a $2^{nd}$ scan unit, a $3^{rd}$ scan unit, a $4^{th}$ scan unit, . . . , an N-th scan unit. The N number of scan units are configured to provide N number of control signals (e.g., gate signals, reset control signals, or light emission control signals) to N number of rows of subpixels. The N number of control signals are denoted as Output1, Output2, Output3, Output4, . . . , OutputN in FIG. 1A. An n-th scan unit is configured to receive a start signal SS or an output signal from an output terminal of a previous scan unit (e.g., a (n−1)-th scan unit, a (n−2)-th scan unit, or a (n−3)-th scan unit). As used herein, the term "previous scan unit" is not limited to immediately previous scan unit (e.g., the (n−1)-th scan unit), but includes any appropriate previous scan unit (e.g., the (n−2)-th scan unit, or the (n−3)-th scan unit). In FIG. 1A, the $1^{st}$ scan unit is configured to receive the start signal SS as the input signal, the $2^{nd}$ scan unit is configured to receive an output signal from the $1^{st}$ scan unit as an input signal Input2, the $3^{rd}$ scan unit is configured to receive an output signal from the $2^{nd}$ scan unit as an input signal Input3, the $4^{th}$ scan unit is configured to receive an output signal from the $3^{rd}$ scan unit as an input signal Input4, the N-th scan unit is configured to receive an output signal from the (N−1)-th scan unit as an input signal InputN.

Referring to FIG. 1A, an n-th scan unit is configured to receive an output signal from a subsequent scan unit (e.g., a (n+1)-th scan unit, a (n+2)-th scan unit, or a (n+3)-th scan unit) as a reset signal. As used herein, the term "subsequent scan unit" is not limited to immediately subsequent scan unit (e.g., the (n+1)-th scan unit), but includes any appropriate subsequent scan unit (e.g., the (n+2)-th scan unit, or the (n+3)-th scan unit). In FIG. 1A, the $1^{st}$ scan unit is configured to receive an output signal from the $2^{nd}$ scan unit as a reset signal Reset1, the $2^{nd}$ scan unit is configured to receive an output signal from the $3^{rd}$ scan unit as a reset signal Reset2, the $3^{rd}$ scan unit is configured to receive an output signal from the $4^{th}$ scan unit as a reset signal Reset3, and the $4^{th}$ scan unit is configured to receive an output signal from the $5^{th}$ scan unit as a reset signal Reset4.

Figure 2A:
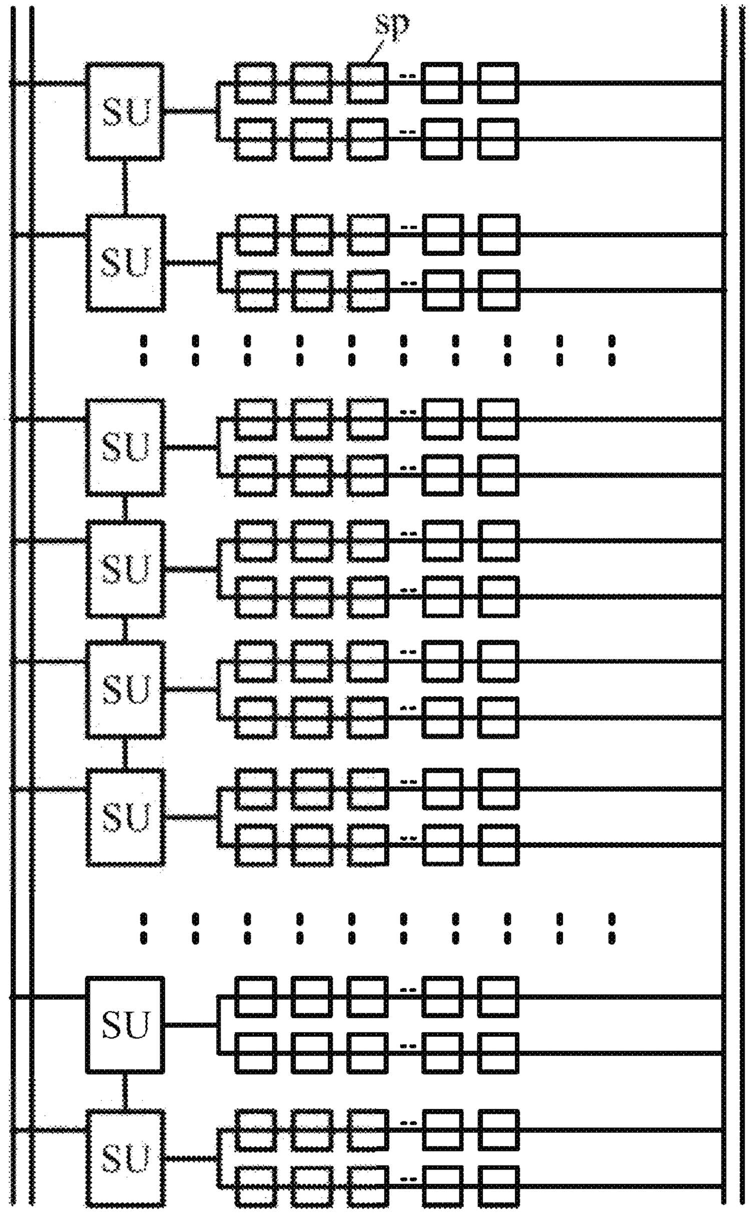
FIG. 2A illustrates an operation of a scan circuit in some embodiments according to the present disclosure.

FIG. 2A illustrates an operation of a scan circuit in some embodiments according to the present disclosure. Referring to FIG. 2A, the scan circuit is configured to drive the array substrate using a single-side driving method. The scan circuit includes a plurality of scan units SU. The plurality of scan units SU are disposed on one side of the array substrate. A respective scan unit of the plurality of scan units SU is configured to provide scan signals to one or more rows of subpixels sp. The scan signals are transmitted from one side of the array substrate to the other side of the array substrate. Thus, a scan signal line transmitting scan signals extends across the array substrate in order to provide scan signals to an entire row of subpixels sp.

Figure 2B:
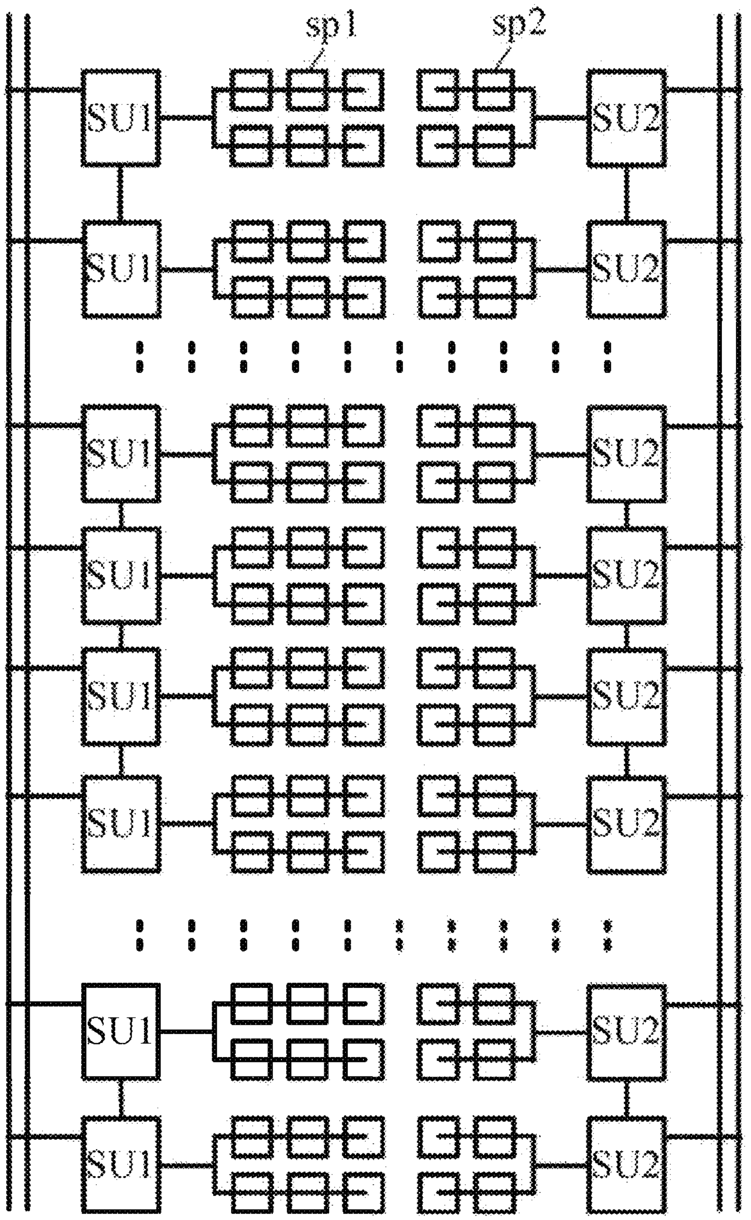
FIG. 2B illustrates an operation of a scan circuit in some embodiments according to the present disclosure.

FIG. 2B illustrates an operation of a scan circuit in some embodiments according to the present disclosure. Referring to FIG. 2B, the scan circuit is configured to drive the array substrate using a dual-side driving method. The scan circuit includes a plurality of first scan units SU1 on a first side of the array substrate and a plurality of second scan units SU2 on a second side of the array substrate. A respective first scan unit of the plurality of first scan units SU1 and a respective second scan unit of the plurality of second scan units SU2 are configured to provide scan signals to a row of subpixels. For example, the respective first scan unit is configured to provide scan signals to multiple first subpixels sp1 in the row, and the respective second scan unit is configured to provide scan signals to multiple second subpixels sp2 in the same row. In the dual-side driving method, a first scan signal line from the respective first scan unit does not need to extend across the array substrate, and a second scan signal line from the respective second scan unit does not need to extend across the army substrate.

Figure 3:
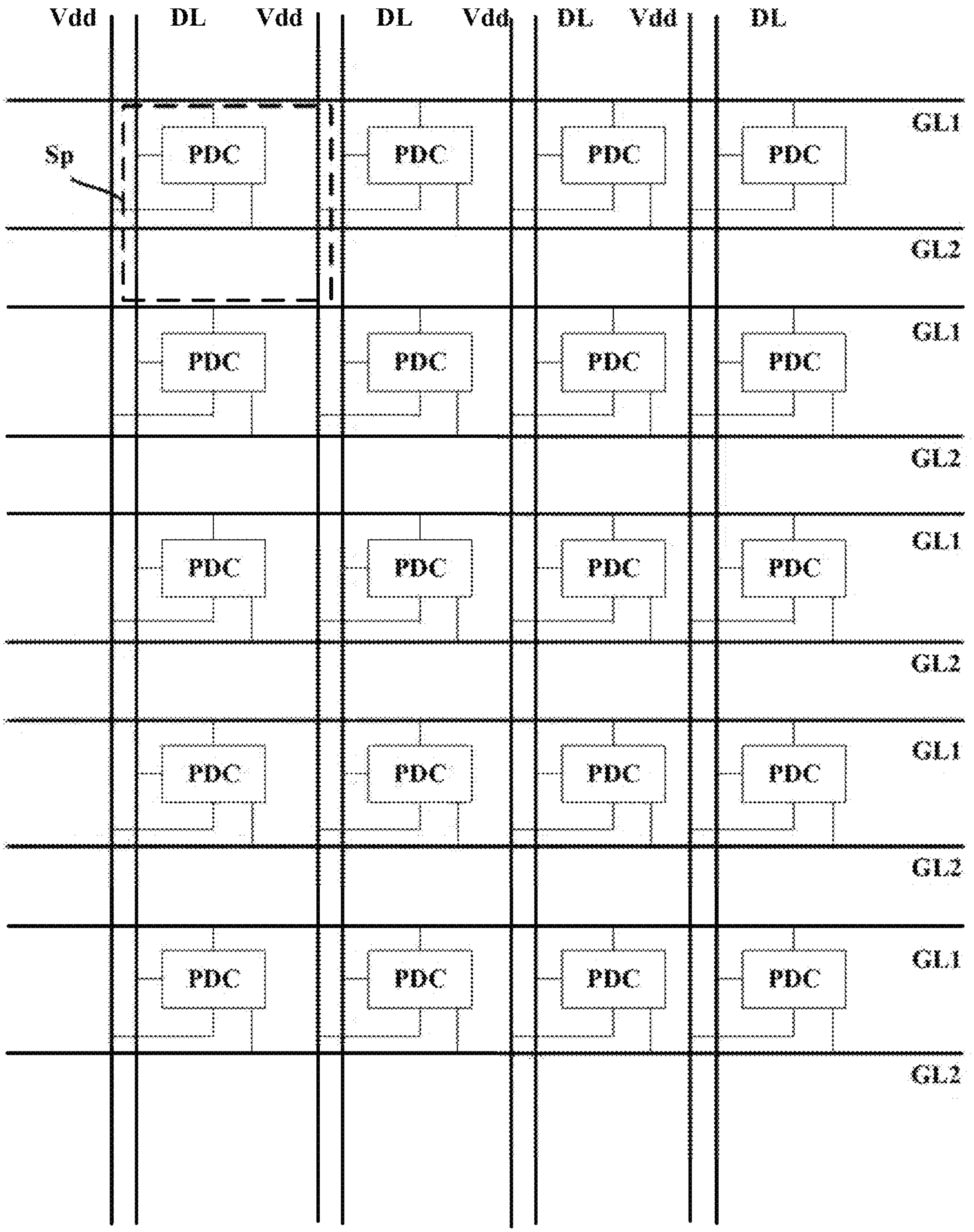
FIG. 3 is a plan view of an array substrate in some embodiments according to the present disclosure.

FIG. 3 is a plan view of an array substrate in some embodiments according to the present disclosure. Referring to FIG. 3, the array substrate includes an array of subpixels Sp. Each subpixel includes an electronic component, e.g., a light emitting element. In one example, the light emitting element is driven by a respective pixel driving circuit PDC. The array substrate includes a plurality of first gate lines GL1, a plurality of second gate lines GL2, a plurality of data lines DL, a plurality of voltage supply line Vdd, and a respective second voltage supply line (e.g., a low voltage supply line Vss). Light emission in a respective subpixel Sp is driven by a respective pixel driving circuit PDC. In one example, a high voltage signal (e.g., a VDD signal) is input, through the respective high voltage supply line of the plurality of voltage supply line Vdd, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage ΔV that drives light emission in the light emitting element.

Figure 4:
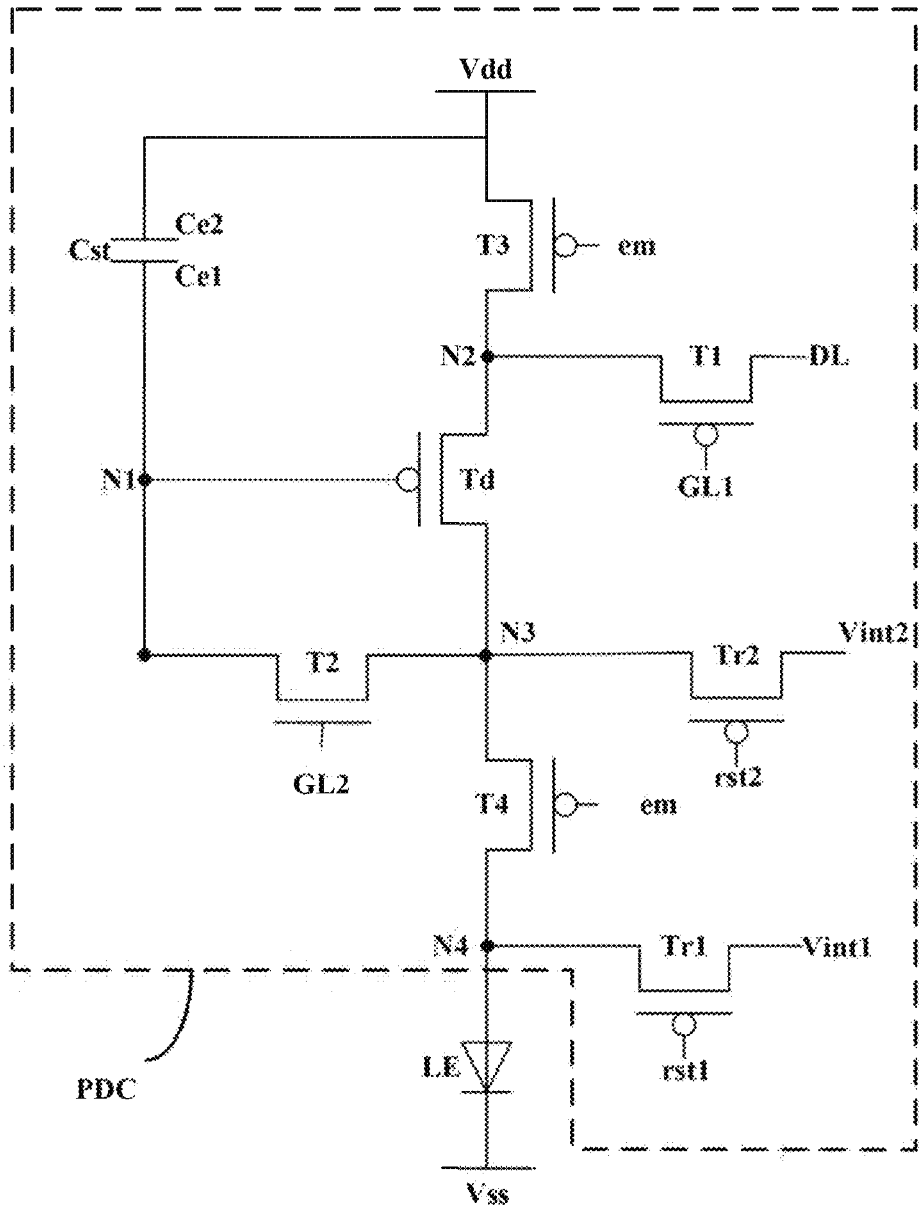
FIG. 4 is a circuit diagram illustrating the structure of a pixel driving circuit in some embodiments according to the present disclosure.

FIG. 4 is a circuit diagram illustrating the structure of a pixel driving circuit in some embodiments according to the present disclosure. Referring to FIG. 4, in some embodiments, the pixel driving circuit includes a driving transistor Td; a storage capacitor Cst having a first capacitor electrode Ce1 and a second capacitor electrode Ce2; a second reset transistor Tr2 having a gate electrode connected to a respective second reset control signal line rst2 of a plurality of second reset control signal lines, a first electrode connected to a respective second reset signal line Vint2 of a plurality of second reset signal lines, and a second electrode connected to a second electrode of the driving transistor Td; a first transistor T1 having a gate electrode connected to a respective first gate line GL1 of a plurality of first gate lines, a first electrode connected to a respective data line DL of a plurality of data lines, and a second electrode connected to a first electrode of the driving transistor Td; a second transistor T2 having a gate electrode connected to a respective second gate line GL2 of a plurality of second gate lines, a first electrode connected to the first capacitor electrode Ce1 of the storage capacitor Cst and the gate electrode of the driving transistor Td, and a second electrode connected to the second electrode of the driving transistor Td; a third transistor T3 having a gate electrode connected to a respective light emitting control signal line em of a plurality of light emitting control signal lines, a first electrode connected to a respective voltage supply line Vdd of a plurality of voltage supply lines, and a second electrode connected to the first electrode of the driving transistor Td and the second electrode of the first transistor T1; a fourth transistor T4 having a gate electrode connected to the respective light emitting control signal line em of a plurality of light emitting control signal lines, a first electrode connected to second electrodes of the driving transistor Td and the second transistor T2, and a second electrode connected to an anode of a light emitting element LE; and a first reset transistor Tr1 having a gate electrode connected to a respective first reset control signal line rst1 of a plurality of first reset control signal lines, a first electrode connected to a respective first reset signal line Vint1 of a plurality of first reset signal lines, and a second electrode connected to the second electrode of the fourth transistor T4 and the anode of the light emitting element LE. The second capacitor electrode Ce2 is connected to the respective voltage supply line and the first electrode of the third transistor T3.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

The pixel driving circuit further include a first node N1, a second node N2, a third node N3, and a fourth node N4. The first node N1 is connected to the gate electrode of the driving transistor Td, the first capacitor electrode Ce1, and the first electrode of the second transistor T2. The second node N2 is connected to the second electrode of the third transistor T3, the second electrode of the first transistor T1, and the first electrode of the driving transistor Td. The third node N3 is connected to the second electrode of the driving transistor Td, the second electrode of the second transistor T2, the first electrode of the fourth transistor T4, and the second electrode of the second reset transistor Tr2. The fourth node N4 is connected to the second electrode of the fourth transistor T4, the second electrode of the first reset transistor Tr1, and the anode of the light emitting element LE.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. Referring to FIG. 4, the second transistor T2 is an n-type transistor such as a metal oxide transistor, and other transistors are p-type transistors such as polysilicon transistors. For a p-type transistor, an effective control signal (e.g., a turn-on control signal) is a low voltage signal, and an ineffective control signal (e.g., a turn-off control signal) is a high voltage signal. For an n-type transistor, an effective control signal (e.g., a turn-on control signal) is a high voltage signal, and an ineffective control signal (e.g., a turn-off control signal) is a low voltage signal.

Figure 5:
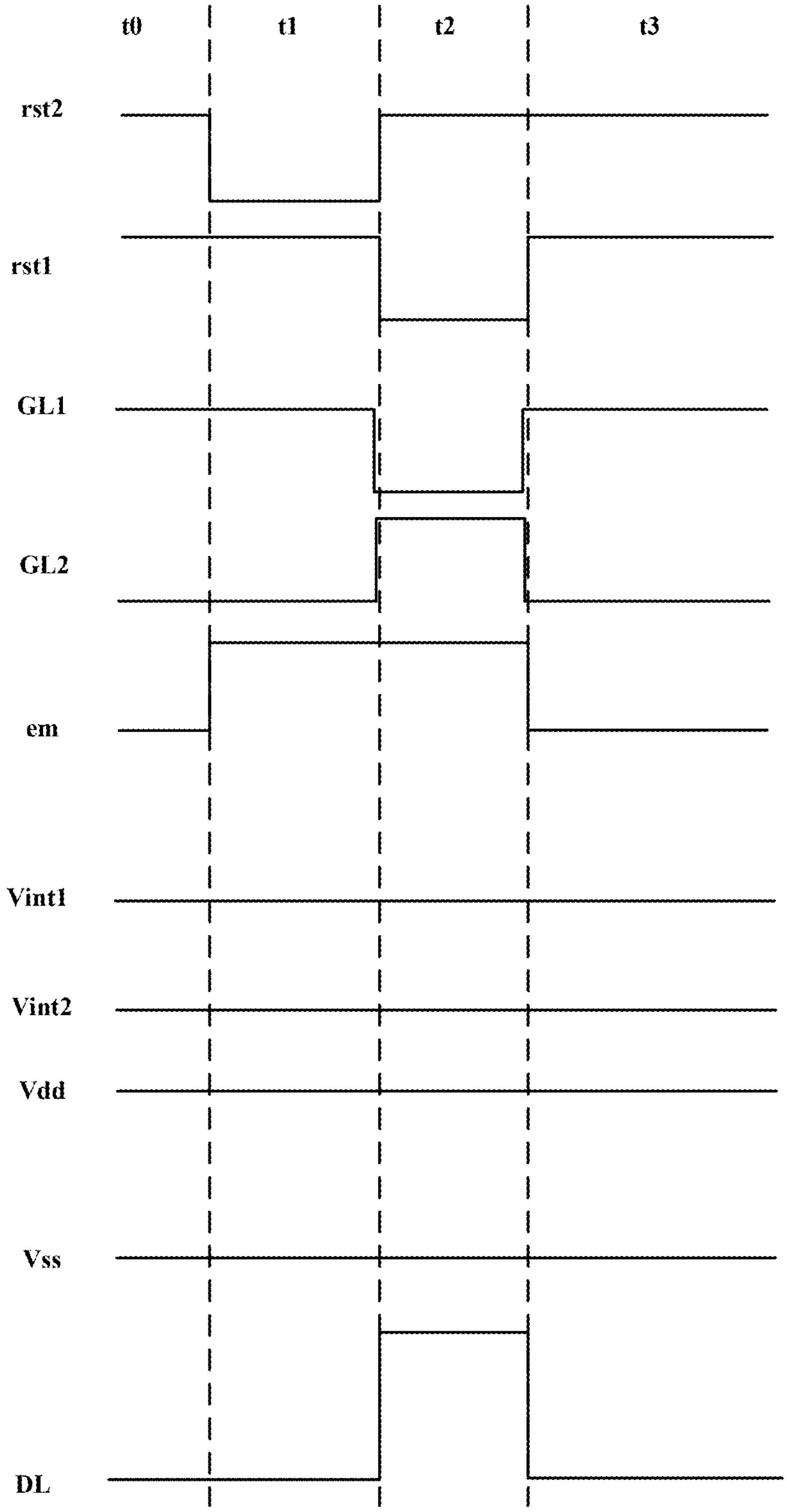
FIG. 5 is a timing diagram illustrating the operation of a pixel driving circuit in some embodiments according to the present disclosure.

FIG. 5 is a timing diagram illustrating the operation of a pixel driving circuit in some embodiments according to the present disclosure. Referring to FIG. 4 and FIG. 5, during one frame of image, the operation of the pixel driving circuit includes a reset sub-phase t1, a data write sub-phase t2, and a light emitting sub-phase t3. In the initial sub-phase t0, a turning-off reset control signal is provided through the respective second reset control signal line rst2 to the gate electrode of the second reset transistor Tr2 to turn off the second reset transistor Tr2. In the initial sub-phase t0, the respective first gate line GL1 and the respective second gate line GL2 are provided with a turning-off signal, thus the first transistor T1 and the second transistor T2 are turned off.

In the reset sub-phase t1, a turning-on reset control signal is provided through the second reset control signal line rst2 to the gate electrode of the second reset transistor Tr2 to turn on the second reset transistor Tr2; allowing an initialization voltage signal from the respective second reset signal line Vint2 to pass from a first electrode of the second reset transistor Tr2 to a second electrode of the second reset transistor Tr2, and in turn to the first capacitor electrode Ce1 and the gate electrode of the driving transistor Td. The gate electrode of the driving transistor Td is initialized. The second capacitor electrode Ce2 receives a high voltage signal from the respective voltage supply line Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective first gate line GL1 and the respective second gate line GL2 are provided with a turning-off signal, thus the first transistor T1 and the second transistor T2 are turned off. The respective light emitting control signal line em is provided with a high voltage signal to turn off the third transistor T3 and the fourth transistor T4.

In the data write sub-phase t2, the turning-off reset control signal is again provided through the respective second reset control signal line rst2 to the gate electrode of the second reset transistor Tr2 to turn off the second reset transistor Tr2. The respective first gate line GL1 and the respective second gate line GL2 are provided with a turning-on signal, thus the first transistor T1 and the second transistor T2 are turned on. A second electrode of the driving transistor Td is connected with the second electrode of the second transistor T2. A gate electrode of the driving transistor Td is electrically connected with the first electrode of the second transistor T2. Because the second transistor T2 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The first transistor T1 is turned on in the data write sub-phase t2. The data voltage signal transmitted through the respective data line DL is received by a first electrode of the first transistor T1, and in turn transmitted to the first electrode of the driving transistor Td, which is connected to the second electrode of the first transistor T1. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line em is provided with a high voltage signal to turn off the third transistor T3 and the fourth transistor T4.

In the data write sub-phase t2, a turning-on reset control signal is provided through the respective first reset control signal line rst1 to the gate electrode of the first reset transistor Tr1 to turn on the first reset transistor Tr1; allowing an initialization voltage signal from the respective first reset signal line Vint1 to pass from a first electrode of the first reset transistor Tr1 to a second electrode of the first reset transistor Tr1; and in turn to the node N4. The anode of the light emitting element LE is initialized.

In the light emitting sub-phase t3, the turning-off reset control signal is again provided through the respective second reset control signal line rst2 to the gate electrode of the second reset transistor Tr2 to turn off the second reset transistor Tr2. The respective first gate line GL1 and the respective second gate line GL2 are provided with a turning-off signal, the first transistor T1 and the second transistor T2 are turned off. The respective light emitting control signal line em is provided with a low voltage signal to turn on the third transistor T3 and the fourth transistor T4. The voltage level at the node N1 in the light emitting sub-phase t3 is maintained at (Vdata+Vth), the driving transistor Td is turned on by the voltage level, and working in the saturation area. A path is formed through the third transistor T3, the driving transistor Td, the fourth transistor T4, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

As shown in FIG. 4 and FIG. 5, several types of scan signals are required for the operation of the pixel driving circuit. Examples of scan signals required for the operation of the pixel driving circuit includes first gate scanning signals for the plurality of first gate lines GL1 for controlling p-type transistors (e.g., the first transistor T1), second gate scanning signals for the plurality of second gate lines GL2 for controlling n-type transistors (e.g., the second transistor T2), light emitting control signals for the plurality of light emitting control signal lines em for controlling light emitting control transistors (e.g., the third transistor T3 and the fourth transistor T4), first reset control signals for the plurality of first reset control signal lines rst1 for controlling first reset transistors (e.g., the first reset transistor Tr1), second reset control signals for the plurality of second reset control signal lines rst2 for controlling second reset transistors (e.g., the second reset transistor Tr2).

Figure 6A:
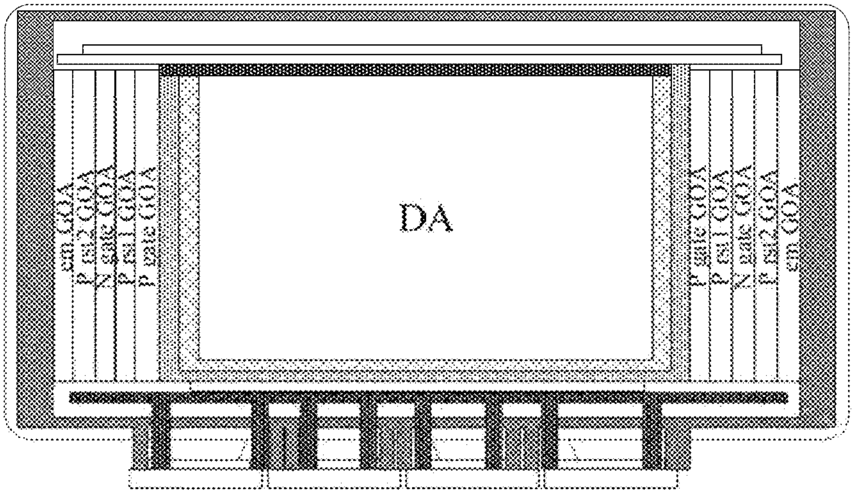
FIG. 6A illustrates a layout of scan circuits in an array substrate in some embodiments according to the present disclosure.

In some embodiments, multiple scan circuits are used for generating the scan signals required for the operation of the pixel driving circuit. Examples of scan circuits for generating the scan signals required for the operation of the pixel driving circuit include a first gate scan circuit configured to generate the first gate scan signals, a second gate scan circuit configured to generate the second gate scan signals, a light emitting control scan circuit configured to generate the light emitting control signals, a first reset scan circuit configured to generate the first reset control signals, and a second reset scan circuit configured to generate the second reset control signals, FIG. 6A illustrates a layout of scan circuits in an array substrate in some embodiments according to the present disclosure. Referring to FIG. 6A, the array substrate includes a plurality of scan circuits. In some embodiments, the plurality of scan circuits includes a first gate scan circuit P gate GOA configured to generate the first gate scan signals, a second gate scan circuit N gate GOA configured to generate the second gate scan signals, a light emitting control scan circuit em GOA configured to generate the light emitting control signals, a first reset scan circuit Prst1 GOA configured to generate the first reset control signals, and a second reset scan circuit Prst2 GOA configured to generate the second reset control signals.

The inventors of the present disclosure discover that RC loading in scan signal lines can be relatively large, particularly in medium and large-size display panels (e.g., a notebook). The inventors of the present disclosure discover that a dual-side driving method is conducive to overcoming the RC loading issue. As shown in FIG. 6A, each of the first gate scan circuit P gate GOA, the second gate scan circuit N gate GOA, the light emitting control scan circuit em GOA, the first reset scan circuit Prst1 GOA, and the second reset scan circuit Prst2 GOA includes scan units on two sides of a display area DA of the array substrate. The operating method of each of the first gate scan circuit P gate GOA, the second gate scan circuit N gate GOA, the light emitting control scan circuit em GOA, the first reset scan circuit Prst1 GOA, and the second reset scan circuit Prst2 GOA is similar to that depicted in FIG. 2B.

The inventors of the present disclosure discover that, however, the array substrate having the dual-side driving scan circuits typically sacrifices its bezel area to accommodate additional scan units on both sides of the display area. Array substrates having the single-side driving scan circuits may be used for achieving an increase display area.

Figure 6B:
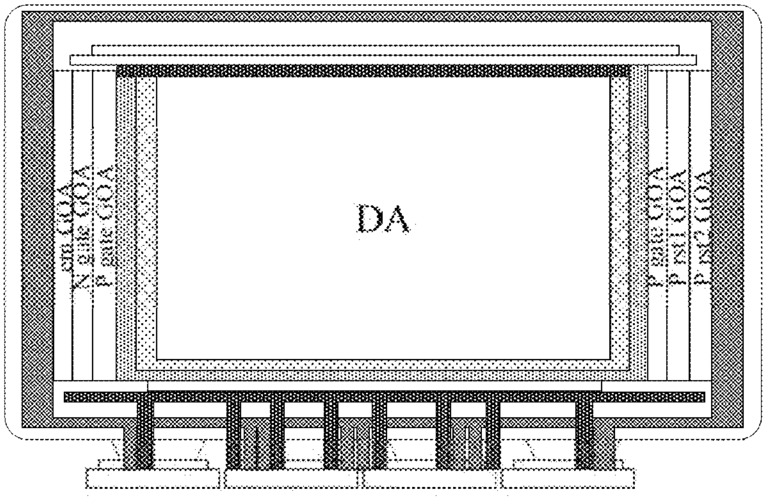
FIG. 6B illustrates a layout of scan circuits in an array substrate in some embodiments according to the present disclosure.

FIG. 6B illustrates a layout of scan circuits in an array substrate in some embodiments according to the present disclosure. Referring to FIG. 6B, the array substrate includes a plurality of scan circuits. In some embodiments, the plurality of scan circuits includes a first gate scan circuit P gate GOA configured to generate the first gate scan signals, a second gate scan circuit N gate GOA configured to generate the second gate scan signals, a light emitting control scan circuit em GOA configured to generate the light emitting control signals, a first reset scan circuit Prst1 GOA configured to generate the first reset control signals, and a second reset scan circuit Prst2 GOA configured to generate the second reset control signals. As shown in FIG. 6B, each of the second gate scan circuit N gate GOA, the light emitting control scan circuit em GOA, the first reset scan circuit Prst1 GOA, and the second reset scan circuit P rst2 GOA includes scan units on only one side of a display area DA of the array substrate. For example, the second gate scan circuit N gate GOA and the light emitting control scan circuit em GOA are disposed on a left side of the display area DA, and the first reset scan circuit P rst1 GOA and the second reset scan circuit P rst2 GOA are disposed on a right side of the display area DA. The operating method of each of the second gate scan circuit N gate GOA, the light emitting control scan circuit em GOA, the first reset scan circuit Prst1 GOA, and the second reset scan circuit P rst2 GOA is similar to that depicted in FIG. 2A.

Figure 7:
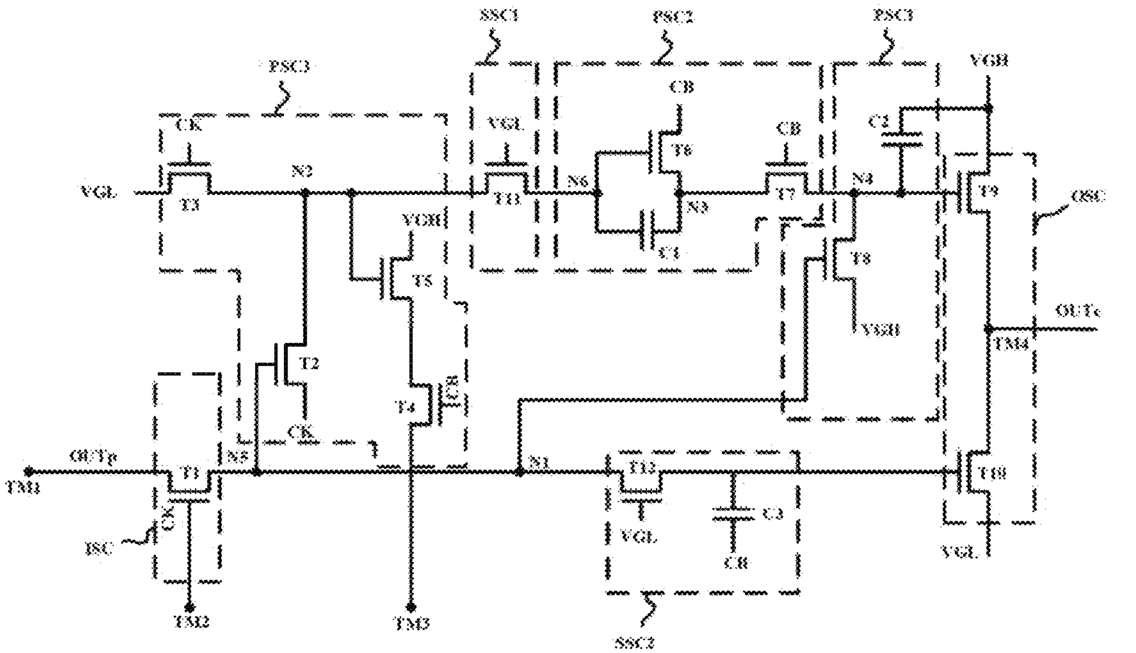
FIG. 7 is a circuit diagram of a respective scan unit of a scan circuit in some embodiments according to the present disclosure.

Various appropriate scan circuits may be used in the present disclosure, FIG. 7 is a circuit diagram of a respective scan unit of a scan circuit in some embodiments according to the present disclosure. Referring to FIG. 7, the respective scan unit in some embodiments includes an input subcircuit ISC, an output subcircuit OSC, a first processing subcircuit PSC1, a second processing subcircuit PSC2, a third processing subcircuit PSC3, a first stabilizing subcircuit SSC1, and a second stabilizing subcircuit SSC2. A respective scan unit may be configured to transmit control signals to one or more rows of subpixels. In one example, the respective scan unit is configured to transmit control signals to a single row of subpixels. In another example, the respective scan unit is configured to transmit control signals to two or more rows of subpixels.

In some embodiments, the output subcircuit OSC is configured to supply the voltage of a first power supply VGH or a second power supply VGL to an output terminal TM4 in response to voltages of a fourth node N4 and a first node N1. Optionally, the output subcircuit OSC includes a ninth transistor T9 and a tenth transistor T10.

The ninth transistor T9 is coupled between a first power supply VGH and the output terminal TM4. A gate electrode of the ninth transistor T9 is coupled to the fourth node N4. The ninth transistor T9 may be turned on or off depending on the voltage of the fourth node N4. Optionally, when the ninth transistor T9 is turned on, the voltage of the first power supply VGH is provided to the output terminal TM4, which (annotated as Outc in FIG. 7) may be transmitted to an n-th gate line and used as a gate driving signal having a gate-on level.

The tenth transistor T10 is coupled between the output terminal TM4 and a second power supply VGL. A gate electrode of the tenth transistor T10 is coupled to the first node N1. The tenth transistor T10 may be turned on or off depending on the voltage of the first node N1. Optionally, when the tenth transistor T10 is turned on, the voltage of the second power supply VGL is provided to the output terminal TM4, which (annotated as Outc in FIG. 7) may be provided to an n-th gate line and used as a gate driving signal having a gate-off level. In one example, when the gate driving signal has a gate-off level, it may be understood that the gate driving signal is not provided.

In some embodiments, the input subcircuit ISC is configured to control the voltages of the first node N1 and a fifth node N5 in response to signals provided to the first input terminal TM1 and the second input terminal TM2, respectively. Optionally, the input subcircuit ISC includes a first transistor T1.

The first transistor T1 is coupled between the first input terminal TM1 and the fifth node N5. A gate electrode of the first transistor T1 is coupled to the second input terminal TM2. When the first clock signal CK is provided to the second input terminal TM2, the first transistor T1 is turned on to electrically couple the first input terminal TM1 with the fifth node N5.

In some embodiments, the first processing subcircuit PSC1 is configured to control the voltage of the fourth node N4 in response to the voltages of the first node N1 and the fifth node N5. Optionally, the first processing subcircuit PSC1 includes an eighth transistor T8 and a second capacitor C2.

The eighth transistor T8 is coupled between the first power supply VGH and the fourth node N4. A gate electrode of the eighth transistor T8 is coupled to the fifth node N5. The eighth transistor T8 may be turned on or off depending on the voltage of the fifth node N5. Optionally, when the eighth transistor T8 is turned on, the voltage of the first power supply VGH may be provided to the fourth node N4.

The second capacitor C2 is coupled between the first power supply VGH and the fourth node N4. Optionally, the second capacitor C2 is configured to charge a voltage to be applied to the fourth node N4. Optionally, the second capacitor C2 is configured to stably maintain the voltage of the fourth node N4.

In some embodiments, the second processing subcircuit PSC2 is coupled to a sixth node N6, and is configured to control the voltage of the fourth node N4 in response to a signal input to the third input terminal TM3. Optionally, the second processing subcircuit PSC2 includes a sixth transistor T6, a seventh transistor T7, and a first capacitor C1.

A first terminal of the first capacitor C1 is coupled to the sixth node N6, and a second terminal of the first capacitor C1 is coupled to a third node N3 that is a common node between the sixth transistor T6 and the seventh transistor T7.

The sixth transistor T6 is coupled between the third node N3 and the sixth node N6. A gate electrode of the sixth transistor T6 is coupled to the sixth node N6. The sixth transistor T6 may be turned on depending on the voltage of the sixth node N6 so that a voltage corresponding to the second clock signal CB provided to the third input terminal TM3 may be applied to the third node N3.

The seventh transistor T7 is coupled between the fourth node N4 and the third node N3. A gate electrode of the seventh transistor T7 is coupled to the third input terminal TM3. The seventh transistor T7 may be turned on in response to the second clock signal CB provided to the third input terminal TM3, and thus, applies the voltage of the first power supply VGH to the third node N3.

In some embodiments, the third processing subcircuit PSC3 is configured to control the voltage of the second node N2. Optionally, the third processing subcircuit PSC3 includes a second transistor T2, a third transistor T3, a fourth transistor T4, and a fifth transistor T5.

The fifth transistor T5 is coupled between the first power supply VGH and the fourth transistor T4. A gate electrode of the fifth transistor T5 is coupled to the second node N2. The fifth transistor T5 may be turned on or off depending on the voltage of the second node N2.

The fourth transistor T4 is coupled between the fifth transistor T5 and the third input terminal TM3. A gate electrode of the fourth transistor T4 is configured to be provided with the second clock signal CB provided to the third input terminal TM3.

The second transistor T2 is coupled between the second node N2 and the second input terminal TM2. A gate electrode of the second transistor T2 is coupled to the fifth node N5.

The third transistor T3 is coupled between the second node N2 and the second power supply VGL. A gate electrode of the third transistor T3 is coupled to the second input terminal TM2. When the first clock signal CK is provided to the second input terminal TM2, the third transistor T3 may be turned on so that the voltage of the second power supply VGL may be provided to the second node N2.

In some embodiments, the first stabilizing subcircuit SSC1 is coupled between the second processing subcircuit PSC2 and the third processing subcircuit PSC3. Optionally, the first stabilizing subcircuit SSC1 is configured to limit a voltage drop width of the second node N2. Optionally, the first stabilizing subcircuit SSC1 includes an eleventh transistor T11.

The eleventh transistor T11 is coupled between the second node N2 and the sixth node N6. A gate electrode of the eleventh transistor T11 is coupled to the second power supply VGL. Since the second power supply VGL has a gate-on level voltage, the eleventh transistor T11 may always remain turned on. Therefore, the second node N2 and the sixth node N6 may be maintained at the same voltage, and operated as substantially the same node.

In some embodiments, the second stabilizing subcircuit SSC2 is coupled between the first node N1 and the output subcircuit OSC. Optionally, the second stabilizing subcircuit SSC2 is configured to limit a voltage drop width of the first node N1. Optionally, the second stabilizing subcircuit SSC2 includes a twelfth transistor T12 and a third capacitor C3.

The twelfth transistor T12 is coupled between the first node N1 and a gate electrode of the tenth transistor T10. A gate electrode of the twelfth transistor T12 is coupled to the second power supply VGL. Since the second power supply VGL has a gate-on level voltage the twelfth transistor T12 may always remain turned on. Therefore, the first node N1 and the gate electrode of the tenth transistor T10 may be maintained at the same voltage.

A first electrode of the third capacitor C3 is coupled to the gate electrode of the tenth transistor T10, and a second electrode of the third capacitor C3 is configured to be provided with the second clock signal CB provided to the third input terminal TM3.

In some embodiments, each of the first to twelfth transistors T1 to T12 may be formed of a p-type transistor. In some embodiments, the gate-on voltage of the first to twelfth transistors T1 to T12 may be set to a low level, and the gate-off voltage thereof may be set to a high level.

Figure 8:
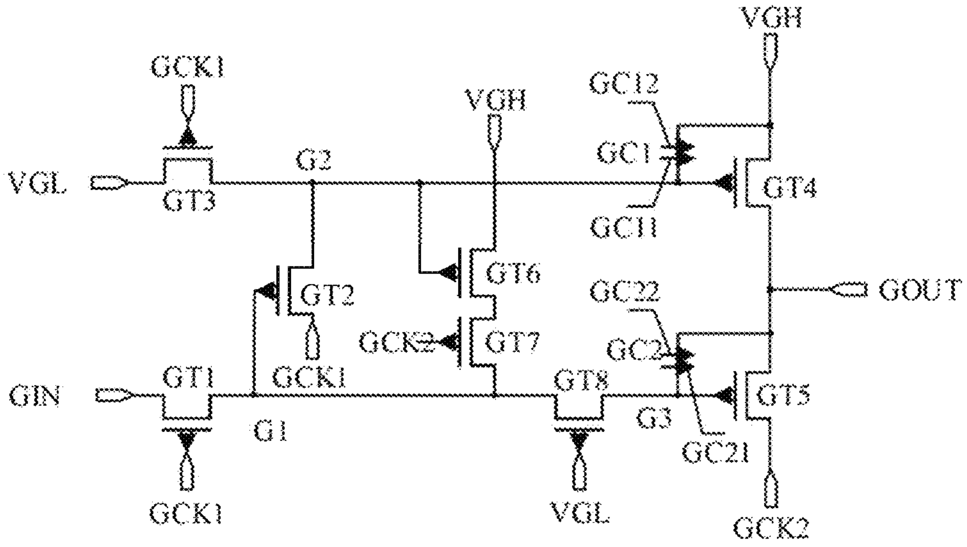
FIG. 8 is a circuit diagram of a respective scan unit of a scan circuit in some embodiments according to the present disclosure.

FIG. 8 is a circuit diagram of a respective scan unit of a scan circuit in some embodiments according to the present disclosure. Referring to FIG. 8, the respective scan unit includes a first control transistor GT1 to an eighth control transistor GT8, a first control capacitor GC1 and a second control capacitor GC2. In some embodiments, a gate electrode of the first control transistor GT1 is electrically connected to a first clock signal terminal GCK1, a first electrode of the first control transistor GT1 is electrically connected to an input terminal GIN, a second electrode of the first control transistor GT1 is electrically connected to a first node G1; a gate electrode of the second control transistor GT2 is electrically connected to the first node G1, a first electrode of the second control transistor GT2 is electrically connected to the first clock signal terminal GCK1, the second electrode of the second control transistor GT2 is electrically connected to a second node G2; a gate electrode of the third control transistor GT3 is electrically connected to a first clock signal terminal GCK1, a first electrode of the third control transistor GT3 is electrically connected to a second power supply VGL, a second electrode of the third control transistor GT3 is electrically connected to the second node G2; a gate electrode of the fourth control transistor GT4 is electrically connected to the second node G2, a first electrode of the fourth control transistor GT4 is electrically connected to a first power supply VGH, a second electrode of the fourth control transistor GT4 is electrically connected to an output terminal GOUT; a gate electrode of the fifth control transistor GT5 is electrically connected to a third node G3, a first electrode of the fifth control transistor GT5 is electrically connected to a second clock signal terminal GCK2, a second electrode of the fifth control transistor GT5 is electrically connected to the output terminal GOUT; a gate electrode of the sixth control transistor GT6 is electrically connected to the second node G2, a first electrode of the sixth control transistor GT6 is electrically connected to the first power supply VGH, a second electrode of the sixth control transistor GT6 is electrically connected to a first electrode of a seventh control transistor GT7; a gate electrode of the seventh control transistor GT7 is electrically connected to the second clock signal terminal GCK2, a second electrode of the seventh control transistor GT7 is electrically connected to the first node G1; a gate electrode of the eighth control transistor GT8 is electrically connected to a second power supply VGL, a first electrode of the eighth control transistor GT8 is electrically connected to the first node G1, a second electrode of the eighth control transistor GT8 is electrically connected to a third node G3; a first electrode plate GC11 of a first control capacitor GC1 is electrically connected to the second node G2, a second electrode plate GC12 of the first control capacitor GC1 is electrically connected to the first power supply VGH, and a first electrode plate GC21 of a second control capacitor GC2 is electrically connected to the third node G3, and a second electrode plate GC22 of the second control capacitor GC2 is electrically connected to the output terminal GOUT. In one example, the first control transistor GT1 to the eighth control transistor GT8 may be a P-type transistor or may be an N-type transistor. In another example, the first power supply VGH provides a continuous high-level signal and the second power supply VGL provides a continuous low-level signal.

Figure 9:
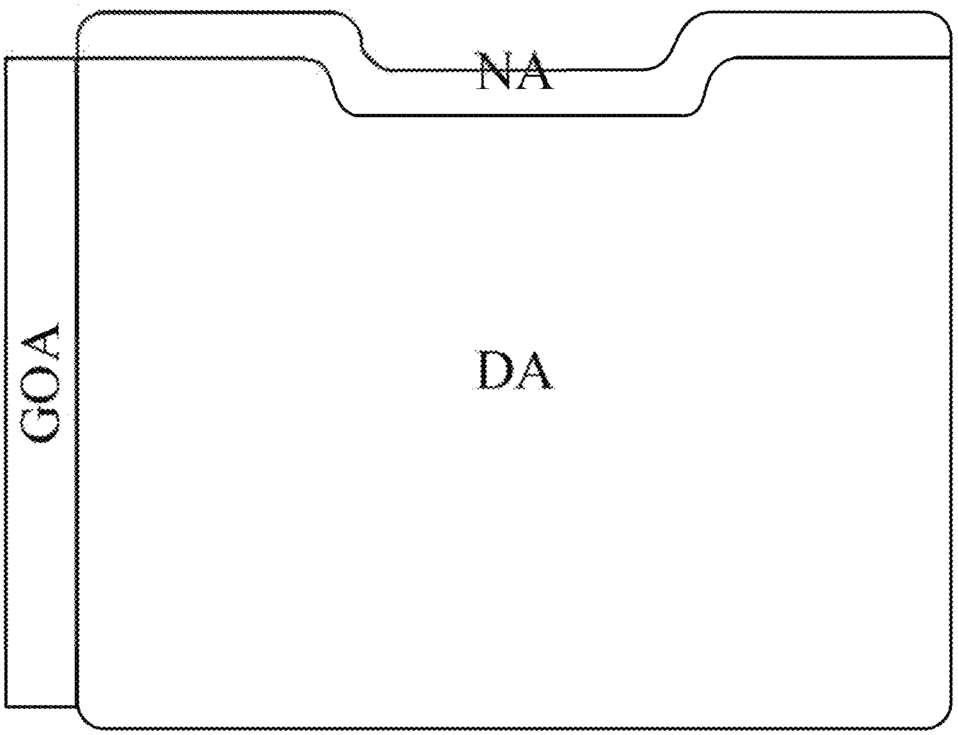
FIG. 9 is a plan view of an array substrate in some embodiments according to the present disclosure.

FIG. 9 is a plan view of an array substrate in some embodiments according to the present disclosure. Referring to FIG. 9, the array substrate in some embodiments includes a display area DA and a notch area NA. As used herein, the term "display area" refers to an area of the array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. As used herein, a "notch area" refers to an area of the array substrate where sensors such as a camera or a light sensor or a touch sensor are disposed. Optionally, the notch area is not capable of display an image. In one example, light emitting elements are absent in the notch area.

Figure 10:
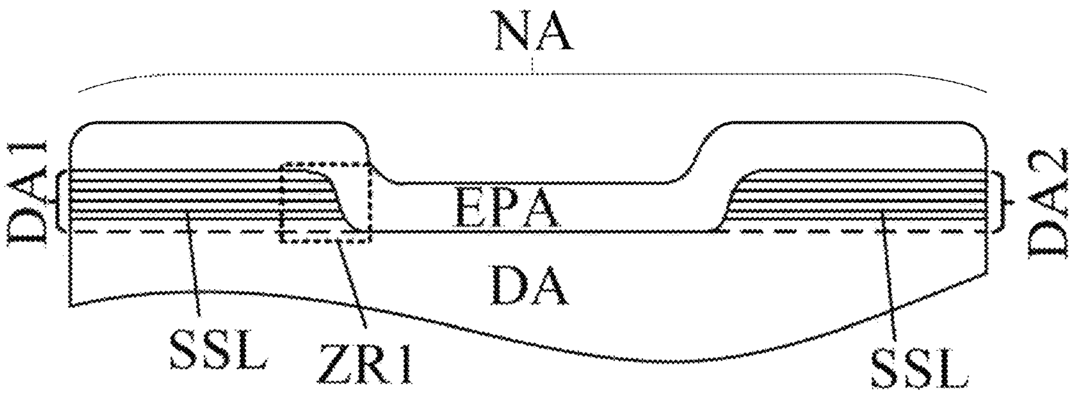
FIG. 10 is a plan view of a portion of an array substrate in some embodiments according to the present disclosure.

FIG. 10 is a plan view of a portion of an array substrate in some embodiments according to the present disclosure. Referring to FIG. 10, the notch area NA in some embodiments includes an electrostatic discharge area EPA. The electrostatic discharge area EPA includes a plurality of electrostatic discharge units for protecting a plurality of data lines. The display area DA includes a first display sub-area DA1 and a second display sub-area DA2. The first display sub-area DA1 and the second display sub-area DA2 are spaced apart from each other by the notch area NA. The array substrate includes one or more rows of subpixels in the first display sub-area DA1 and the second display sub-area DA2. A same row of subpixel in the first display sub-area DA1 and the second display sub-area DA2 is interrupted into two parts in the first display sub-area DA1 and the second display sub-area DA2, respectively.

Referring to FIG. 9, the array substrate in some embodiments further includes a scan circuit GOA on one side of the display area DA. The scan circuit GOA is operated according to a single-side driving method. The array substrate further includes a plurality of scan signal lines SSL extending through the first display sub-area DA1 and the second display sub-area DA2. Due to the presence of the notch area NA, a respective scan signal line of the plurality of scan signal lines SSL does not extend from the first display sub-area DA1 to the second display sub-area DA2 as a straight line. The portion of the respective scan signal line in the first display sub-area DA1 and the portion of the respective scan signal line in the second display sub-area DA2 are connected through a portion in the notch area NA. Because the scan circuit GOA is operated according to a single-side driving method, the portion of the respective scan signal line in the first display sub-area DA1 must be connected to the portion of the respective scan signal line in the second display sub-area DA2 in order to drive the subpixels in the second display sub-area DA2.

Figure 11A:
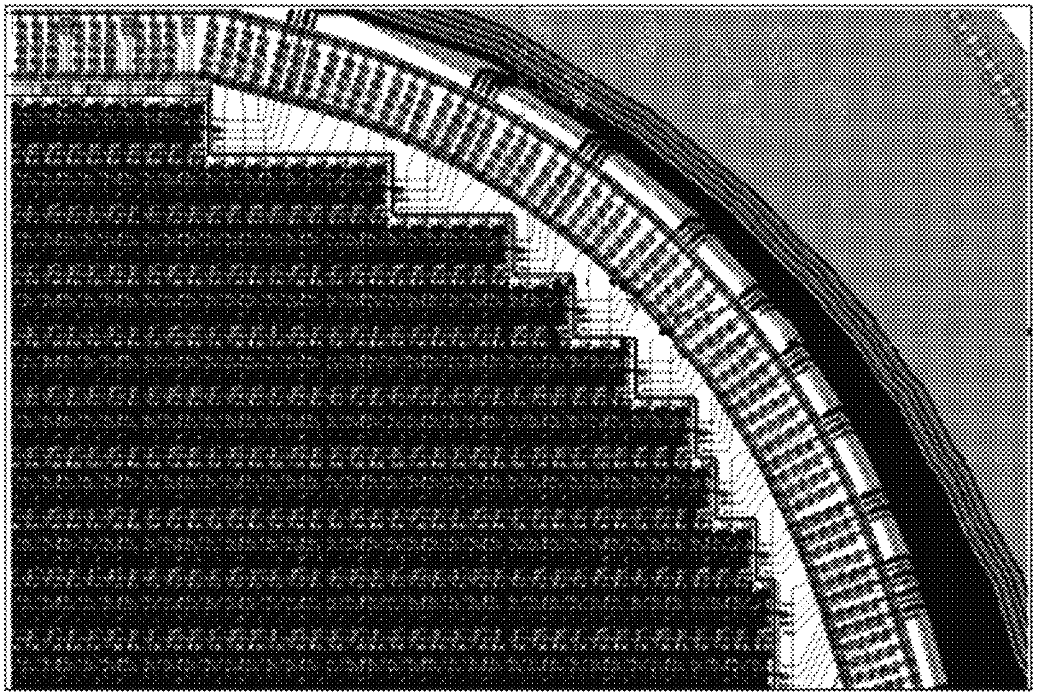
FIG. 11A is a zoom-in view of a zoom-in region in FIG. 10.
Figure 11B:
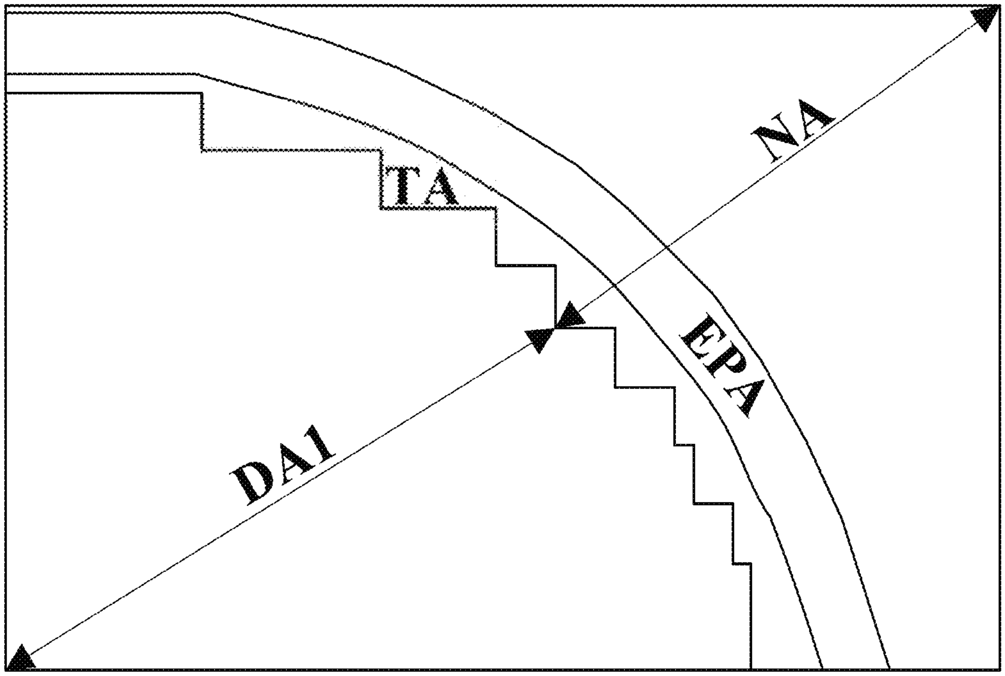
FIG. 11B is a schematic view illustrating the first zoom-in region of FIG. 11A.

FIG. 11A is a zoom-in view of a first zoom-in region in FIG. 10. A first zoom-in region ZR1 is denoted in FIG. 10, FIG. 11A is a zoom-in view of the first zoom-in region ZR1 in FIG. 10. FIG. 11B is a schematic view illustrating the first zoom-in region of FIG. 11A. Referring to FIG. 11A and FIG. 11B, the notch area in some embodiments includes an electrostatic discharge area EPA, and a transition area TA. The transition area TA is between the electrostatic discharge area EPA and the first display sub-area DA1 (another portion of the transition area TA is between the electrostatic discharge area EPA and the second display sub-area). As discussed above, the electrostatic discharge area EPA includes a plurality of electrostatic discharge units for protecting a plurality of data lines. The transition area TA is absent of the plurality of electrostatic discharge units.

Figure 11C:
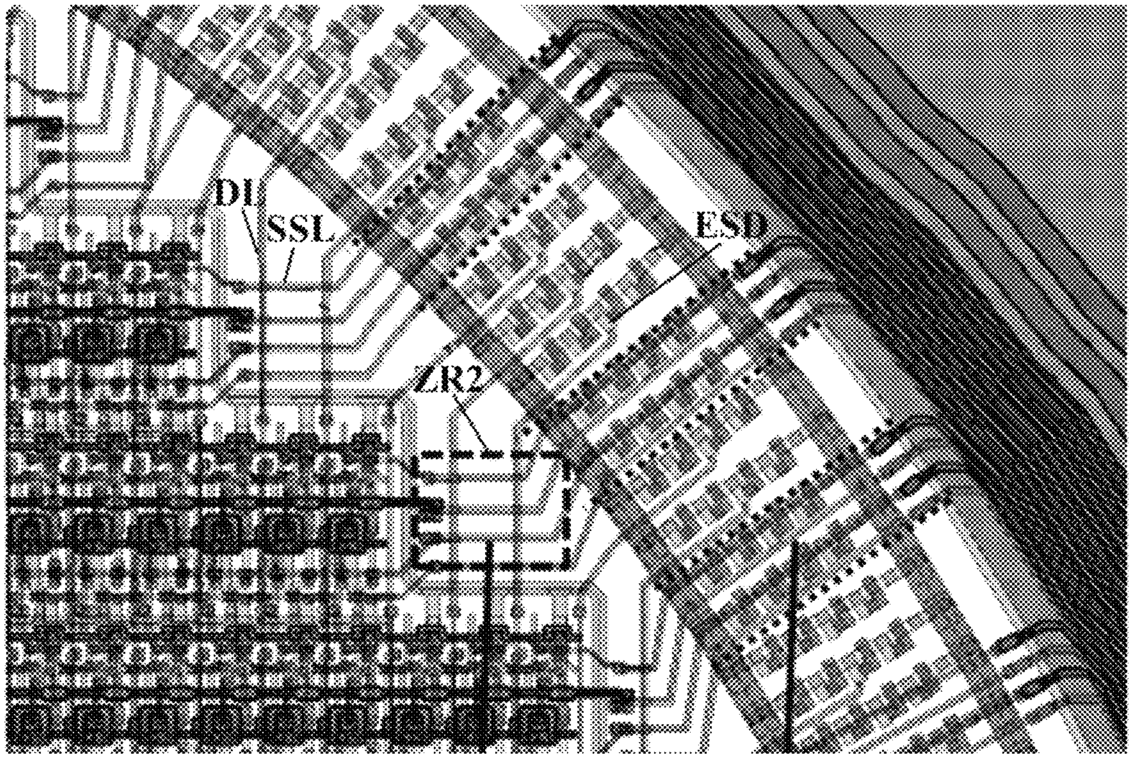
FIG. 11C is a zoom-in view of a portion of the first zoom-in region in FIG. 11A.

FIG. 11C is a zoom-in view of a portion of the first zoom-in region in FIG. 11A. FIG. 11C is a zoom-in view of a region having a portion of the transition area, a portion of the first display sub-area, and a portion of the electrostatic discharge area. In FIG. 11C, a plurality of data lines are denoted as "DL", a plurality of scan signal lines are denoted as "SSL", and a plurality of electrostatic discharge units are denoted as "ESD".

Figure 11D:
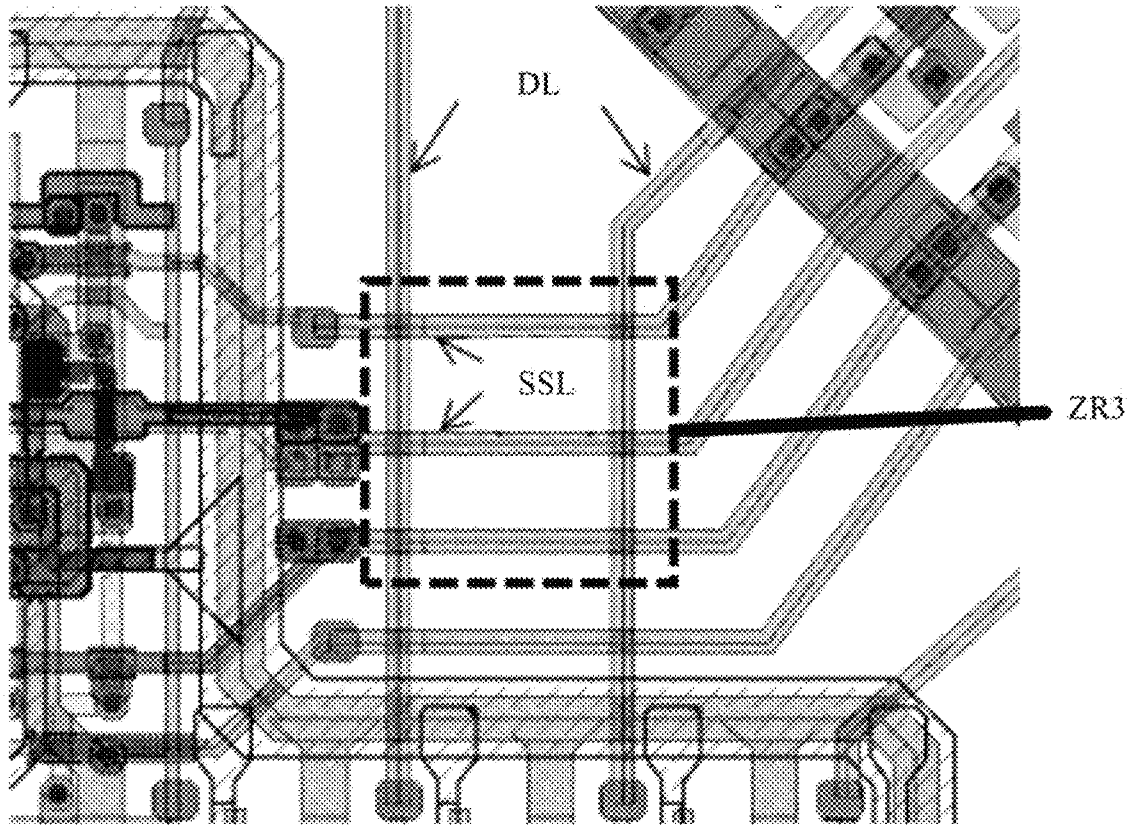
FIG. 11D is a zoom-in view of a second zoom-in region ZR2 in FIG. 11C.
Figure 11E:
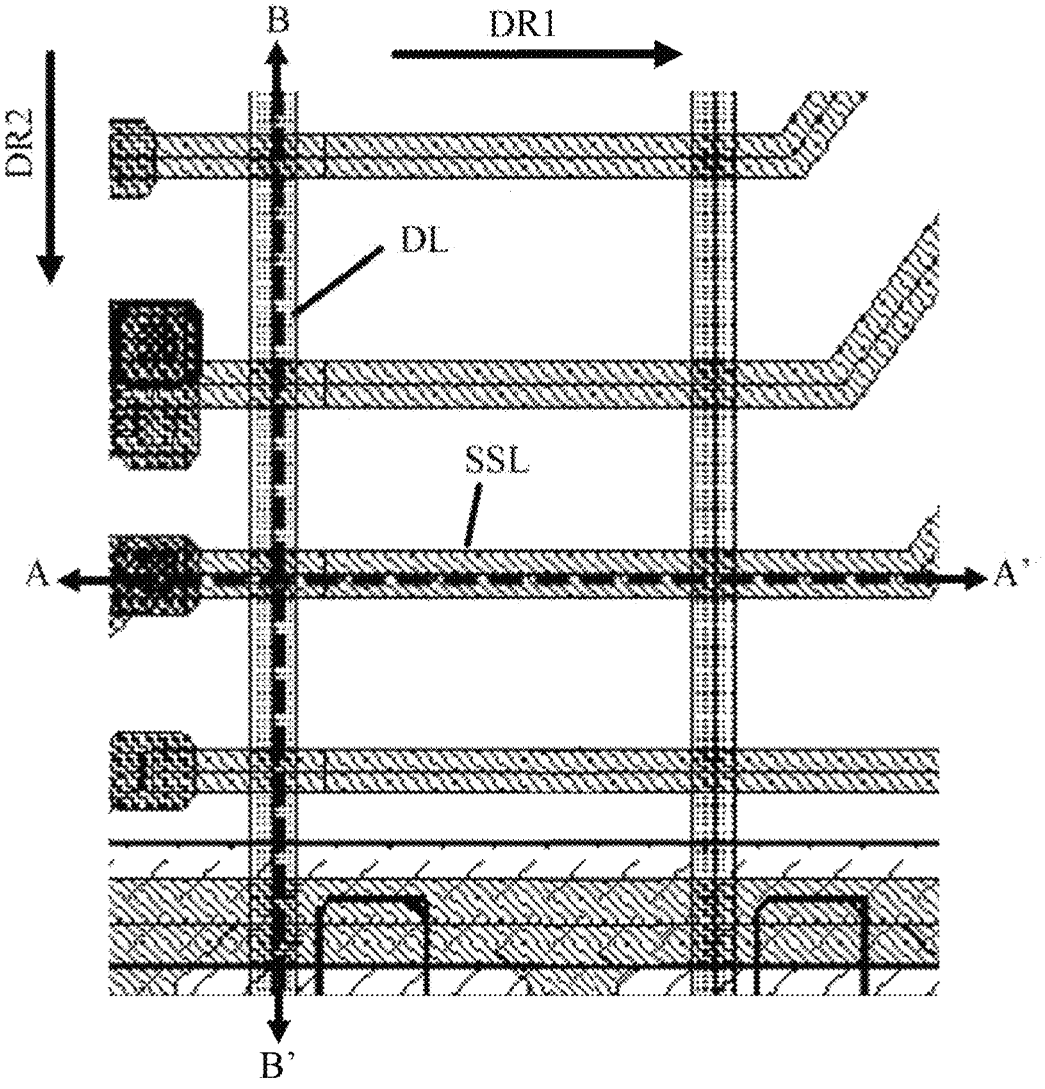
FIG. 11E is a zoom-in view of a third zoom-in region ZR3 in FIG. 11D.

FIG. 11D is a zoom-in view of a second zoom-in region ZR2 in FIG. 11C. FIG. 11E is a zoom-in view of a third zoom-in region ZR3 in FIG. 11D. Referring to FIG. 11C to FIG. 11E, in the transition area TA, a plurality of data lines DL and a plurality of scan signal lines SSL cross over each other. Optionally, portions of the plurality of scan signal lines SSL that cross over the plurality of data lines DL respectively extend along a first direction DR1. Optionally, portions of the plurality of data lines DL that cross over the plurality of scan signal lines SSL respectively extend along a second direction DR2. Optionally, the first direction DR1 and the second direction DR2 are substantially perpendicular to each other. As used herein, the term "substantially perpendicular" means that an angle is in the range of approximately 75 degrees to approximately 105 degrees, e.g., approximately 75 degrees to approximately 80 degrees, approximately 80 degrees to approximately 85 degrees, approximately 85 degrees to approximately 90 degrees, approximately 90 degrees to approximately 95 degrees, approximately 95 degrees to approximately 100 degrees, or approximately 100 degrees to approximately 105 degrees.

In some embodiments, a respective scan signal line of the plurality of scan signal lines SSL includes one or more portions other than the portion that crosses over one or more data lines. The one or more portions other than the portion that crosses over one or more data lines may extend along a direction different from the first direction DR1.

In some embodiments, a respective data line of the plurality of data lines DL includes one or more portions other than the portion that crosses over one or more scan signal lines. The one or more portions other than the portion that crosses over one or more scan signal lines may extend along a direction different from the second direction DR2.

In some embodiments, multiple scan signal lines from a same row of subpixels cross over a same number of data lines. Optionally, multiple scan signal lines from at least one row of subpixels cross over two data lines.

The inventors of the present disclosure discover that, by having the first direction DR1 and the second direction DR2 substantially perpendicular to each other, and having multiple scan signal lines from a same row of subpixels cross over a same number of data lines, parasitic capacitance between each of the plurality of scan signal lines SSL and the plurality of data lines can be substantially uniform, e.g., deviating from each other by less than 15%, less than 10%, less than 5%, less than 1%, or less than 0.5%.

Figure 12A:
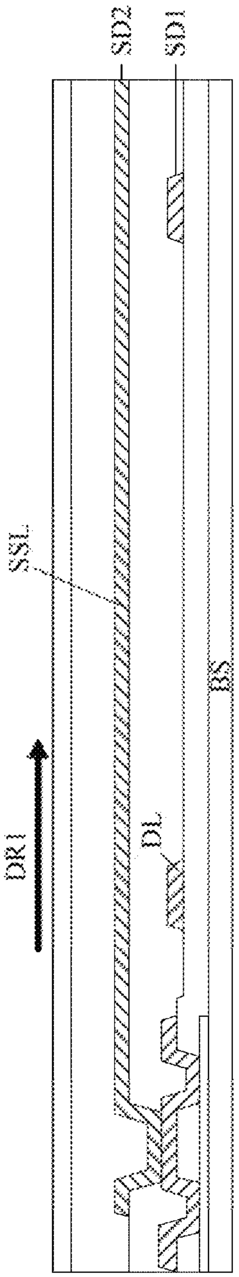
FIG. 12A is a cross-sectional view along an A-A' line in FIG. 11E.
Figure 12B:
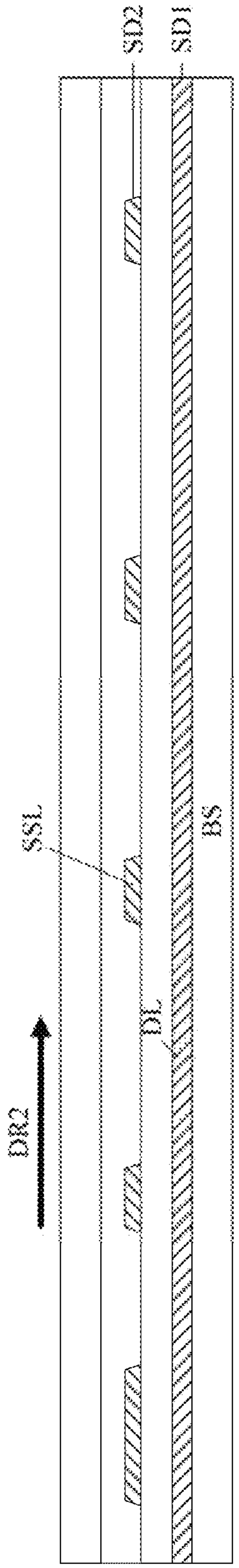
FIG. 12B is a cross-sectional view along a B-B' line in FIG. 11E.

FIG. 12A is a cross-sectional view along an A-A' line in FIG. 11E. Referring to FIG. 12A, portions of the plurality of scan signal lines SSL that cross over the plurality of data lines DL respectively extend along a first direction DR1. FIG. 12B is a cross-sectional view along a B-B' line in FIG. 11E. Referring to FIG. 12B, portions of the plurality of data lines DL that cross over the plurality of scan signal lines SSL respectively extend along a second direction DR2. Referring to FIG. 12A and FIG. 12B, in some embodiments, the plurality of data lines. DL are in a first signal line layer SD1, and the plurality of scan signal lines SSL are in a second signal line layer SD2 on a side of the first signal line layer SD1 away from a base substrate BS.

Figure 13:
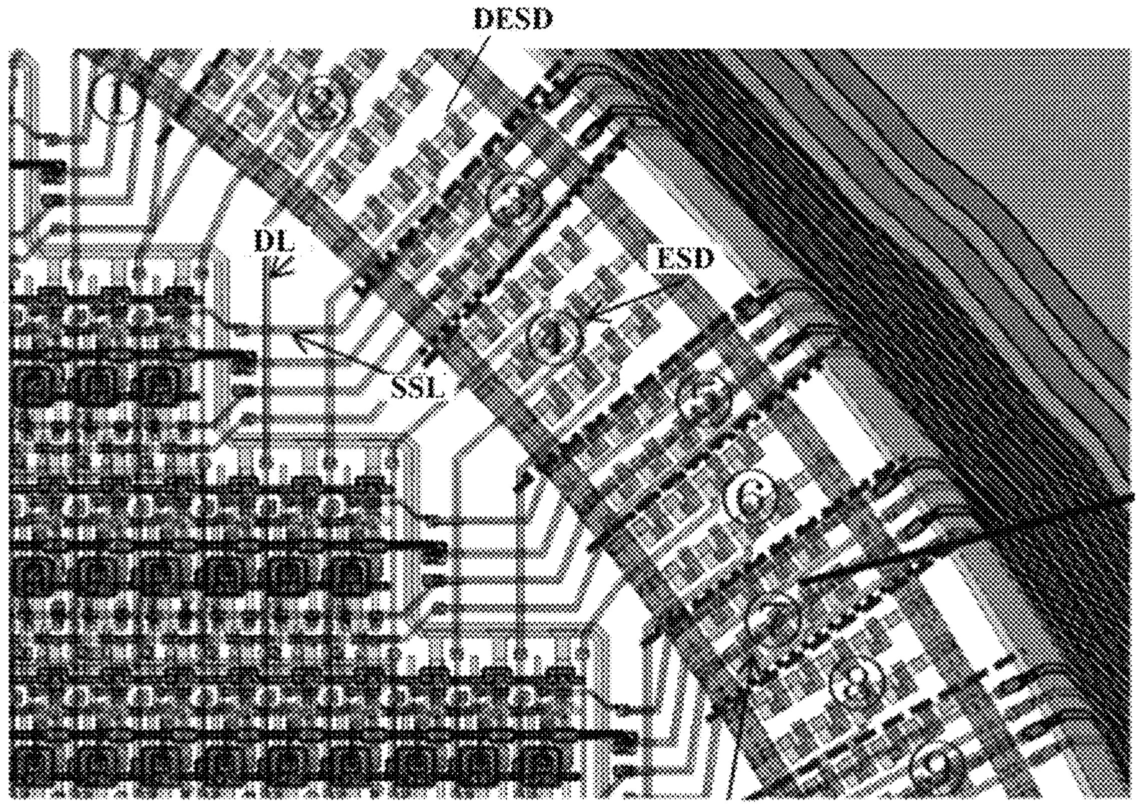
FIG. 13 is a plan view of a portion of an array substrate in some embodiments according to the present disclosure.
Figure 14A:
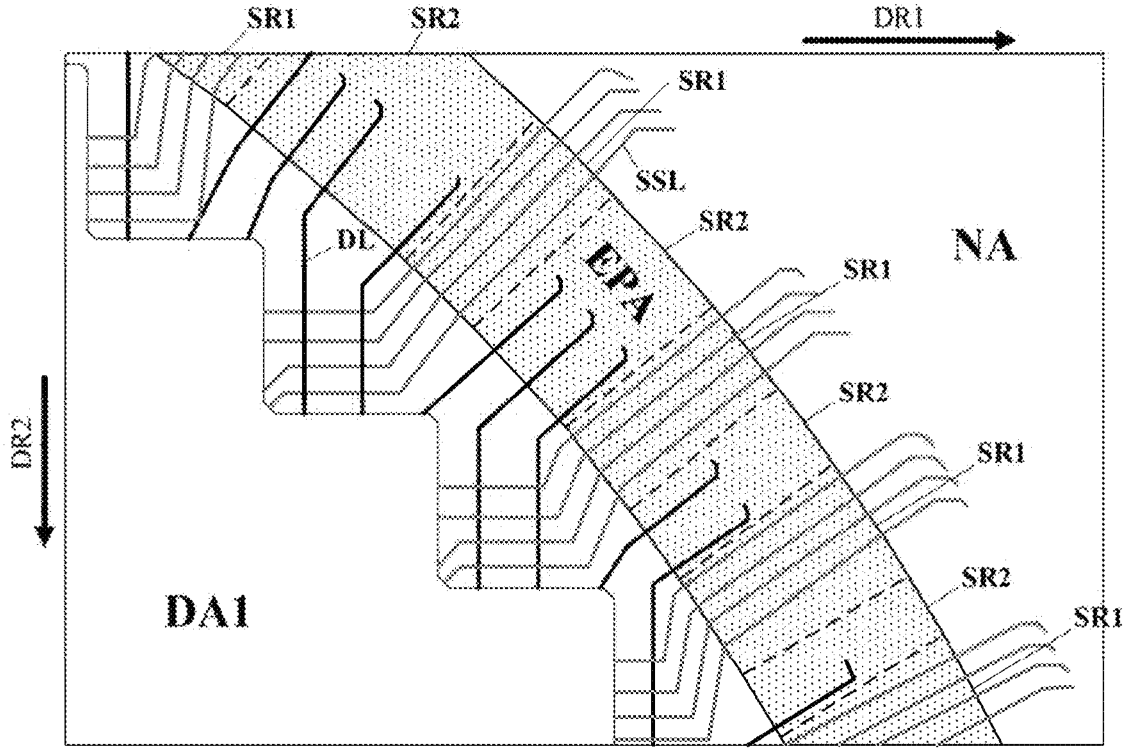
FIG. 14A is a schematic diagram of a layout of signal lines in FIG. 13.
Figure 14B:
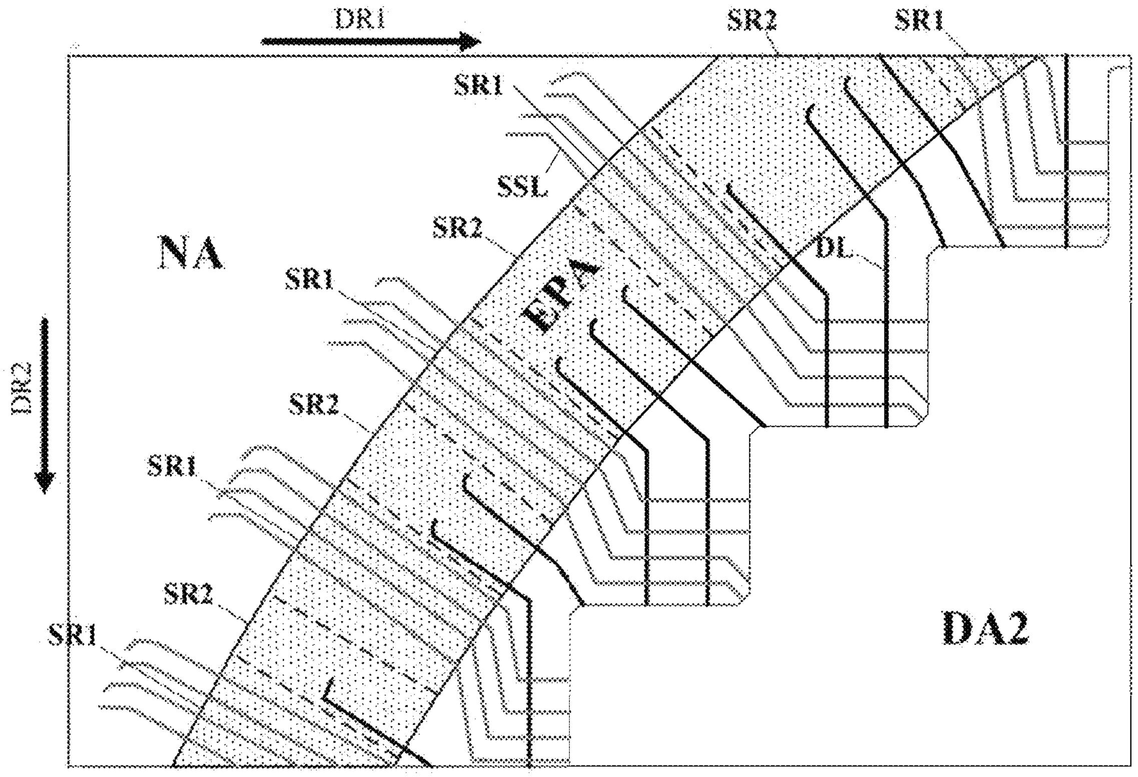
FIG. 14B is a schematic diagram of a layout of signal lines in a portion of an array substrate in some embodiments according to the present disclosure.

FIG. 13 is a plan view of a portion of an array substrate in some embodiments according to the present disclosure. FIG. 14A is a schematic diagram of a layout of signal lines in FIG. 13. FIG. 14B is a schematic diagram of a layout of signal lines in a portion of an array substrate in some embodiments according to the present disclosure. FIG. 14A illustrate the layout of signal lines in a portion of an array substrate adjacent to the first display sub-area DA1. FIG. 14B illustrate the layout of signal lines in a portion of an array substrate adjacent to the second display sub-area DA2. Pixel driving circuits in the first display sub-area DA1 and the second display sub-area DA2 are omitted in FIG. 14A and FIG. 14B, but are shown in FIG. 13. Electrostatic discharge units in the electrostatic discharge area EPA are omitted in FIG. 14A and FIG. 14B, but are shown in FIG. 13. FIG. 14A and FIG. 14B illustrate the layout of signal lines in the electrostatic discharge area EPA.

Referring to FIG. 13, FIG. 14A, and FIG. 14B, the notch area in some embodiments includes an electrostatic discharge area EPA, and a transition area TA. The transition area TA is between the electrostatic discharge area EPA and the first display sub-area DA1, or between the electrostatic discharge area EPA and the second display sub-area DA2. As discussed above, the electrostatic discharge area EPA includes a plurality of electrostatic discharge units for protecting a plurality of data lines. The transition area TA is absent of the plurality of electrostatic discharge units.

Referring to FIG. 13, FIG. 14A, and FIG. 14B, in some embodiments, the plurality of data lines DL at least partially extend into the electrostatic discharge area EPA; and the plurality of scan signal lines SSL at least partially extend into the electrostatic discharge area EPA. Optionally, the plurality of scan signal lines SSL cross over the electrostatic discharge area EPA.

In some embodiments, at least a portion of the electrostatic discharge area EPA includes a plurality of first sub-regions SR1 and a plurality of second sub-regions SR2 alternately arranged. The plurality of scan signal lines SSL are present in the plurality of first sub-regions SR1, and absent in the plurality of second sub-regions SR2. The plurality of data lines DL are present in the plurality of second sub-regions SR2, and absent in the plurality of first sub-regions SR1.

In some embodiments, at least one first sub-region of the plurality of first sub-regions SR1 includes multiple scan signal lines. Optionally, a respective first sub-region of the plurality of first sub-regions SR1 includes multiple scan signal lines. In some embodiments, at least one second sub-region of the plurality of second sub-regions SR2 includes at least one data line, e.g., multiple data lines. Optionally, a respective second sub-region of the plurality of second sub-regions SR2 includes at least one data line, e.g., multiple data lines.

In some embodiments, scan signal lines, which extend from the first display sub-area DA1 and cross over a portion of the electrostatic discharge area EPA adjacent to the first display sub-area DA1, are connected with scan signal lines, which extend from the second display sub-area DA2 and cross over a portion of the electrostatic discharge area EPA adjacent to the second display sub-area DA2. When a single-side driving scan circuit is used in the array substrate, the connection ensures the scan signals can be transmitted from the first display sub-area DA1 to the second display sub-area DA2, or from the second display sub-area DA2 to the first display sub-area DA1. When a single-side driving scan circuit is disposed on a side of the first display sub-area DA1 away from the second display sub-area DA2, the connection ensures the scan signals can be transmitted from the first display sub-area DA1 to the second display sub-area DA2 to drive the subpixels in the second display sub-area DA2. When a single-side driving scan circuit is disposed on a side of the second display sub-area DA2 away from the first display sub-area DA1, the connection ensures the scan signals can be transmitted from the second display sub-area DA2 to the first display sub-area DA1 to drive the subpixels in the first display sub-area DA1.

The inventors of the present disclosure discover that, by having alternately arranged first sub-regions and second sub-regions in at least a portion of the electrostatic discharge area EPA, and by having a respective first sub-region (e.g., sub-regions 1, 3, 5, 7, and 9 denoted in FIG. 13) receiving exclusively scan signal lines and having a respective second sub-region (e.g., sub-regions 2, 4, 6, and 8 denoted in FIG. 13) receiving exclusively data lines, each of the scan signal line across the electrostatic discharge area EPA may have a substantially the same parasitic capacitance with components in the electrostatic discharge units. The parasitic capacitance between the scan signal lines of the electrostatic discharge units are distributed in a highly ordered pattern. The parasitic capacitance between each scan signal line and the electrostatic discharge units are substantially the same. By having this intricate structure, it ensures that low-grayscale mura in the notch area are distributed in a highly ordered pattern, which is conducive to efficient and effective mura compensation using appropriate demura algorithms.

In some embodiments, the electrostatic discharge area EPA includes a plurality of electrostatic discharge units ESD for protecting the plurality of data lines, e.g., discharging electrostatic charges in the electrostatic discharge area EPA. In some embodiments, the electrostatic discharge area EPA further includes a plurality of dummy electrostatic discharge units DESD.

Figure 15:
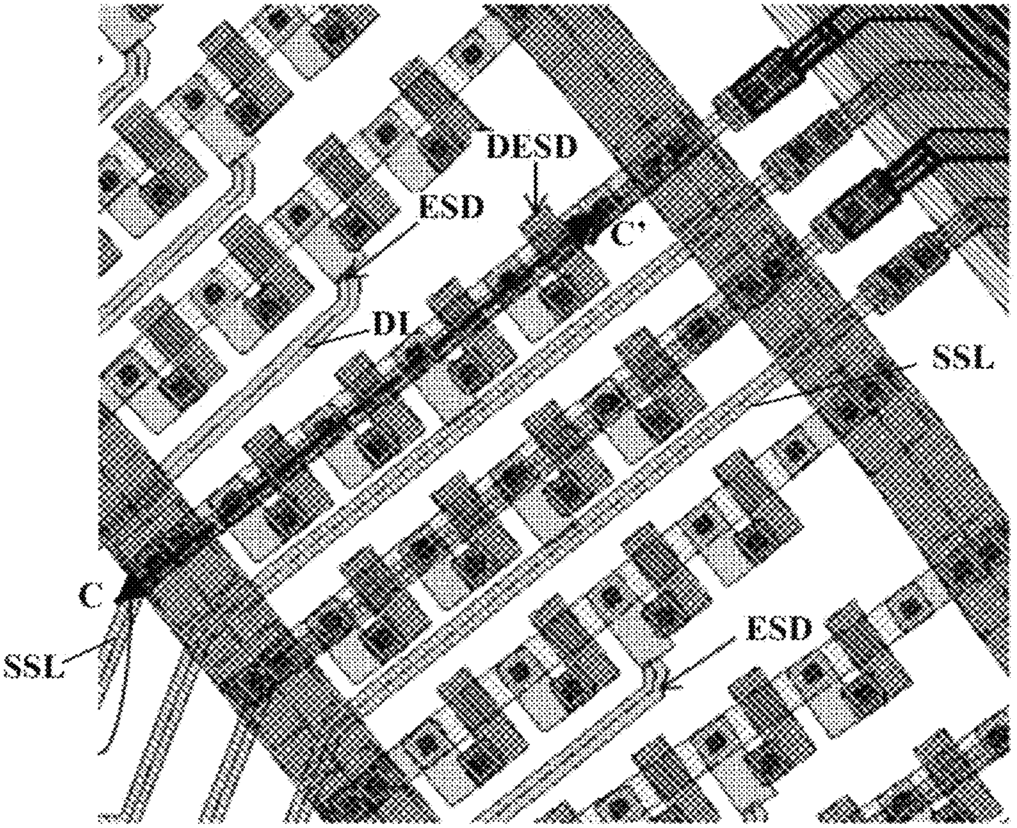
FIG. 15 is a schematic diagram of a layout of signal lines and electrostatic discharge units in a portion of an array substrate in some embodiments according to the present disclosure.
Figure 16:
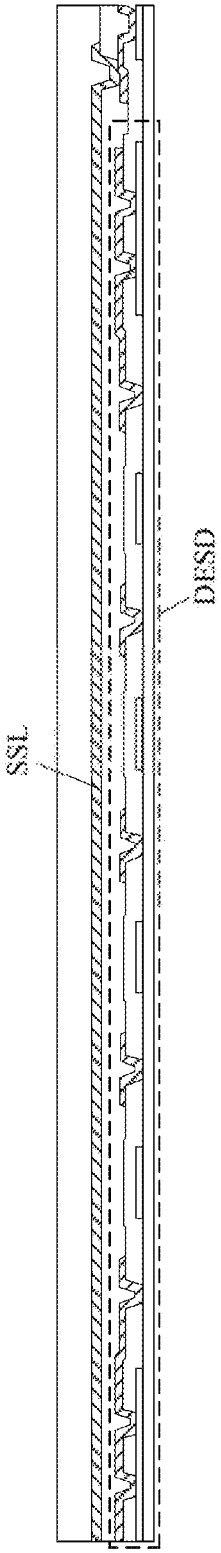
FIG. 16 is a cross-sectional view along a C-C' line in FIG. 15.

FIG. 15 is a schematic diagram of a layout of signal lines and electrostatic discharge units in a portion of an array substrate in some embodiments according to the present disclosure. FIG. 16 is a cross-sectional view along a C-C' line in FIG. 15. Referring to FIG. 15 and FIG. 16, in addition to the plurality of electrostatic discharge units ESD for protecting the plurality of data lines, the electrostatic discharge area EPA further includes a plurality of dummy electrostatic discharge units DESD. An orthographic projection of an individual scan signal line of the plurality of scan signal lines SSL in an individual first sub-region of the plurality of first sub-regions SR1 on a base substrate partially overlaps with an orthographic projection of multiple dummy electrostatic discharge units of the plurality of dummy electrostatic discharge units DESD on the base substrate. The inventors of the present disclosure discover that, by having the plurality of dummy electrostatic discharge units DESD, an etching uniformity in the process of fabricating the array substrate can be achieved, particularly an etching uniformity in the process of forming transistors of the electrostatic discharge units.

As used herein, the term "dummy" refers to an electrostatic discharge unit that has a structure that is the same as or similar to an active electrostatic discharge unit, but the structure is only used for a configuration existing as a pattern, without actually performing a function in the array substrate. Thus, an electrical signal may not be applied to a "dummy" electrostatic discharge unit or even in a case in which an electrical signal is applied thereto, the "dummy" electrostatic discharge unit may not perform an electrically equivalent function.

In some embodiments, at least a portion of the electrostatic discharge area EPA includes a plurality of first sub-regions SR1 and a plurality of second sub-regions SR2 alternately arranged. The plurality of dummy electrostatic discharge units DESD are present in the plurality of first sub-regions SR1, and absent in the plurality of second sub-regions SR2. The plurality of electrostatic discharge units ESD are present in the plurality of second sub-regions SR2, and absent in the plurality of first sub-regions SR1.

In some embodiments, the plurality of scan signal lines SSL and the plurality of dummy electrostatic discharge units DESD are present in the plurality of first sub-regions SR1, and absent in the plurality of second sub-regions SR2. The plurality of data lines DL and the plurality of electrostatic discharge units ESD are present in the plurality of second sub-regions SR2, and absent in the plurality of first sub-regions SR1.

The inventors of the present disclosure further discover that, by having alternately arranged first sub-regions and second sub-regions in at least a portion of the electrostatic discharge area EPA, by having a respective first sub-region receiving exclusively scan signal lines and dummy electrostatic discharge units, and by having a respective second sub-region receiving exclusively data lines and electrostatic discharge units, a substantially uniform inter-scan signal line loading can be achieved, and the risk of interference from the scan signals to the data lines or the electrostatic discharge units can be reduced.

Figure 17:
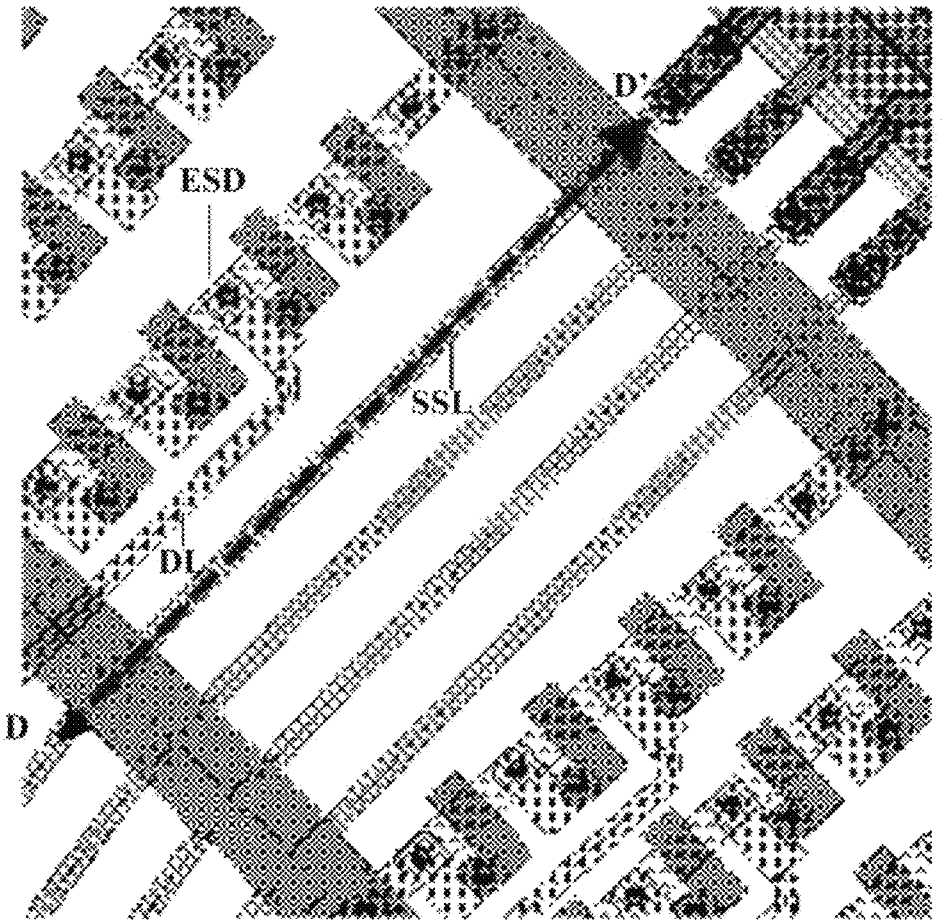
FIG. 17 is a schematic diagram of a layout of signal lines in a portion of an array substrate in some embodiments according to the present disclosure.
Figure 18:
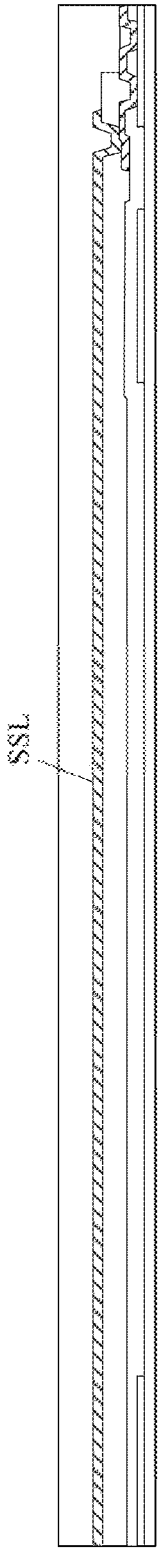
FIG. 18 is a cross-sectional view along a D-D' line in FIG. 17.

FIG. 17 is a schematic diagram of a layout of signal lines in a portion of an array substrate in some embodiments according to the present disclosure. FIG. 18 is a cross-sectional view along a D-D' line in FIG. 17. Referring to FIG. 17 and FIG. 18, in some embodiments, the electrostatic discharge area does not include a plurality of dummy electrostatic discharge units. By having no dummy electrostatic discharge units underneath the scan signal lines, any potential damage caused by electrostatic discharge between the scan signal lines and the dummy electrostatic discharge units can be avoided.

Figure 19:
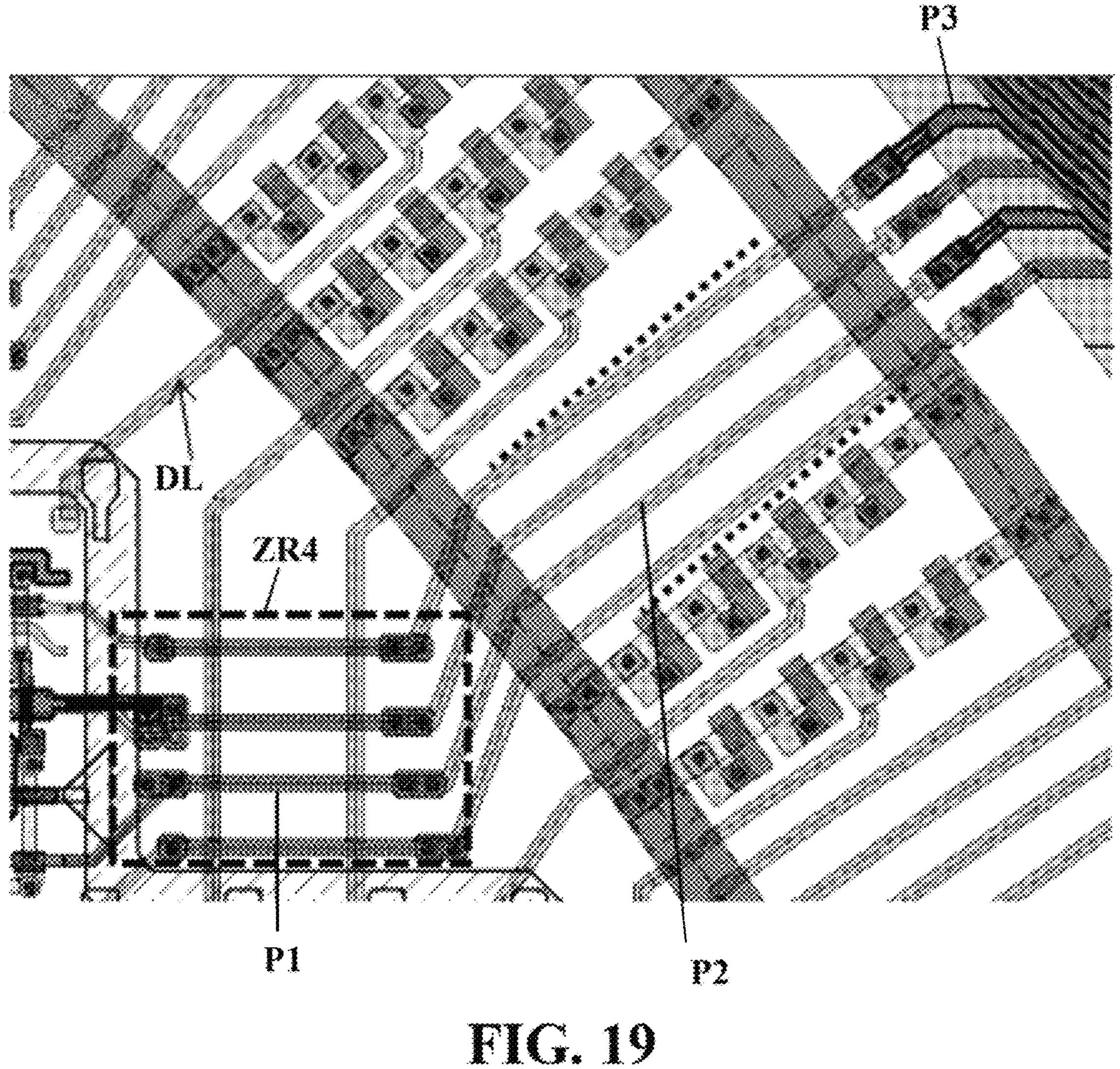
FIG. 19 is a schematic diagram of a layout of signal lines in a portion of an array substrate in some embodiments according to the present disclosure.
Figure 20:
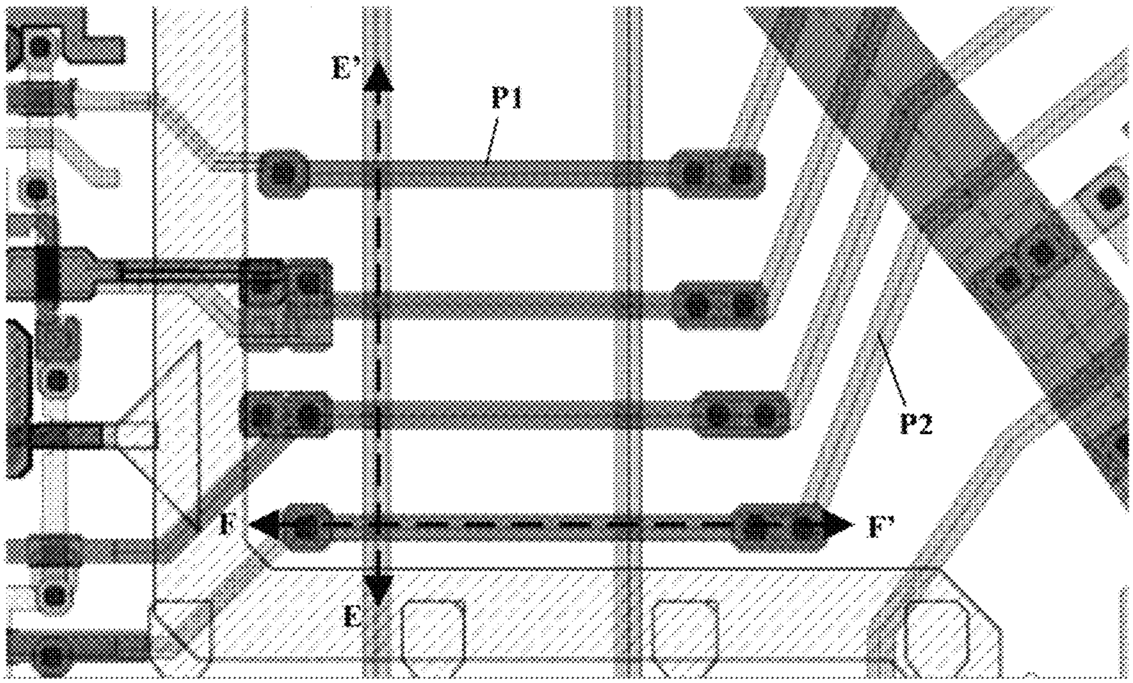
FIG. 20 is a zoom-in view of a fourth zoom-in region ZR4 in FIG. 19.
Figure 21:
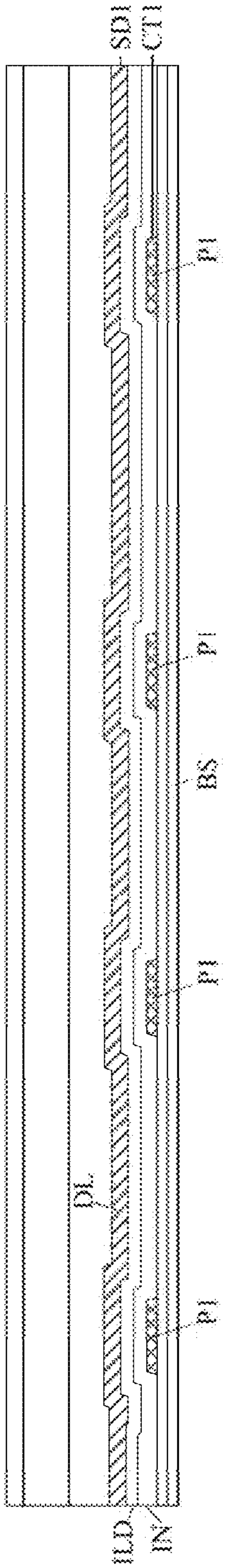
FIG. 21 is a cross-sectional view along a E-E' line in FIG. 20.
Figure 22:
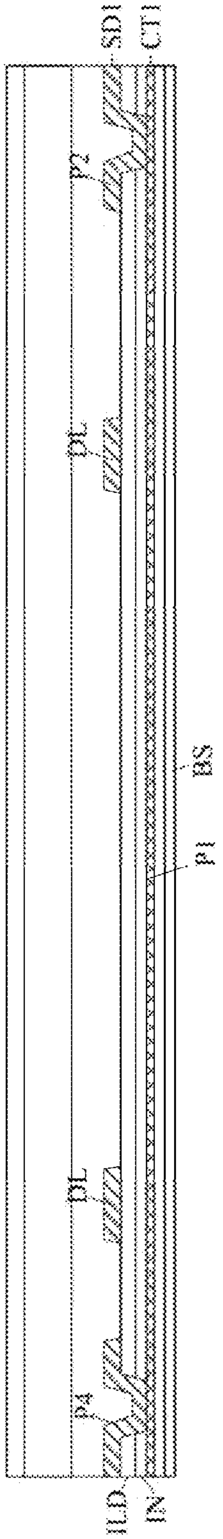
FIG. 22 is a cross-sectional view along an F-F' line in FIG. 20.

FIG. 19 is a schematic diagram of a layout of signal lines in a portion of an array substrate in some embodiments according to the present disclosure. FIG. 20 is a zoom-in view of a fourth zoom-in region ZR4 in FIG. 19. FIG. 21 is a cross-sectional view along a E-E' line in FIG. 20. FIG. 22 is a cross-sectional view along an F-F' line in FIG. 20. Referring to FIG. 19 to FIG. 22, in some embodiments, a respective scan signal line of the plurality of scan signal lines SSL that cross over the transition area TA and the electrostatic discharge area EPA includes a first portion P1, a second portion P2, and a third portion P3. The first portion P1 is a portion that crosses over one or more data lines in the transition area TA. Optionally, the first portion P1 extends along a first direction DR1. The second portion P2 crosses over the electrostatic discharge area EPA. The third portion P3 is at least partially in a portion of the notch area NA on a side of the electrostatic discharge area EPA away from the transition area TA. Optionally, the second portion P2 connects the first portion P1 with the third portion P3.

In some embodiments, the first portion P1 is in a layer different from the second portion P2. Referring to FIG. 20 to FIG. 22, in some embodiments, the first portion P1 is in a first conductive layer CT1, and the second portion P2 is in a first signal line layer SD1 on a side of the first conductive layer CT1 away from a base substrate BS. The inventors of the present disclosure discover that, by having this intricate structure of scan signal lines, the fabrication process may be further simplified, for example, a number of mask plates used in the fabrication process can be reduced by two.

In some embodiments, the respective scan signal line of the plurality of scan signal lines SSL that cross over the transition area TA and the electrostatic discharge area EPA further includes a fourth portion P4 at least partially in the display area (e.g., in the first display sub-area DA1 or the second display sub-area DA2). Optionally, the first portion P1 connects the fourth portion P4 with the second portion P2. Optionally, the fourth portion P4 is in the first signal line layer SD1. Optionally, the fourth portion P4 is connected to the first portion P1 through a via extending through an inter-layer dielectric layer ILD and an insulating layer IN. Optionally, the second portion P2 is connected to the first portion P1 through a via extending through an inter-layer dielectric layer ILD and an insulating layer IN.

In some embodiments, the second portion P2 is in a same layer as the plurality of data lines DL. In some embodiments, the fourth portion P4 is in a same layer as the plurality of data lines DL. Optionally, the plurality of data lines DL is in the first signal line layer SD1.

Figure 23:
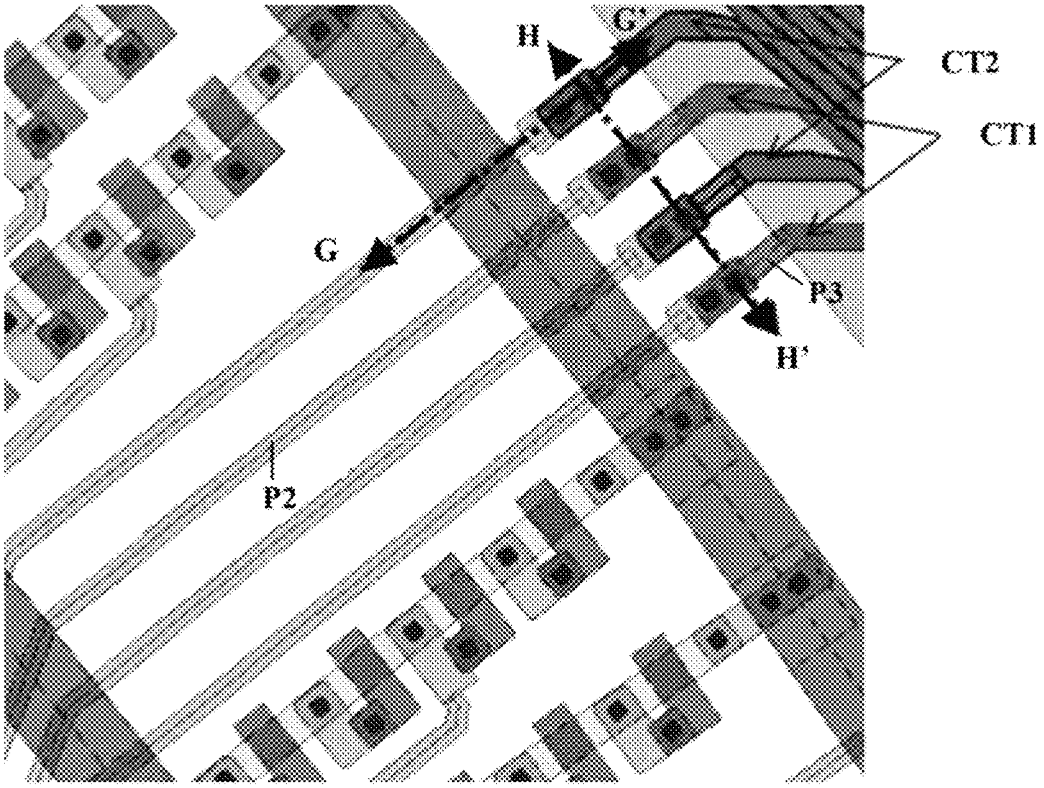
FIG. 23 is a schematic diagram of a layout of signal lines in a portion of an array substrate in some embodiments according to the present disclosure.
Figure 24:
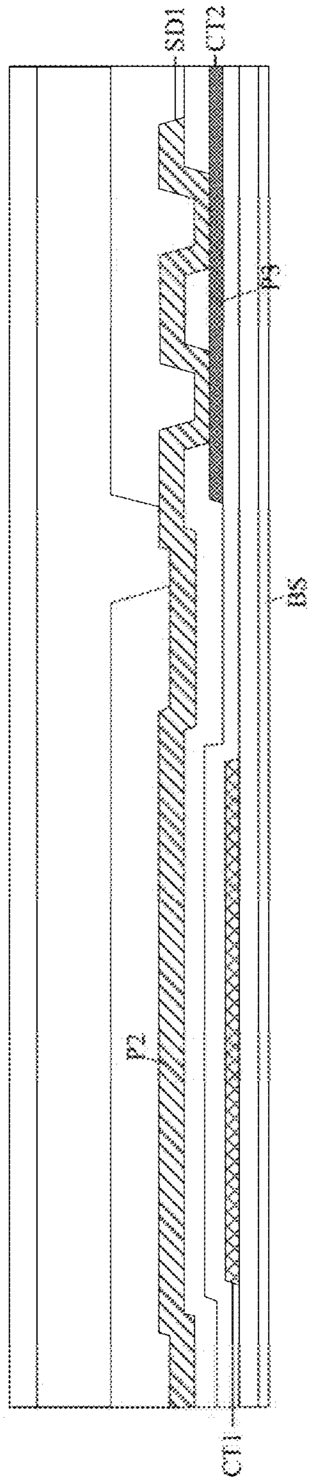
FIG. 24 is a cross-sectional view along a G-G' line in FIG. 23.
Figure 25:
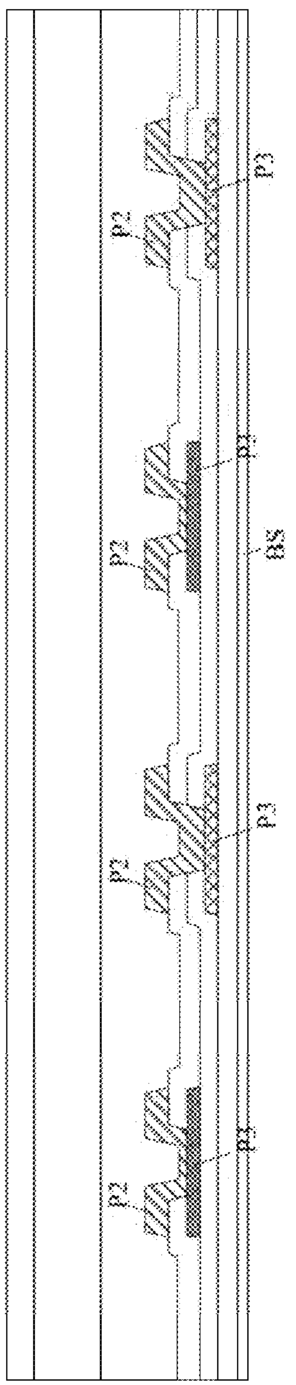
FIG. 25 is a cross-sectional view along an H-H' line in FIG. 23.

FIG. 23 is a schematic diagram of a layout of signal lines in a portion of an array substrate in some embodiments according to the present disclosure. FIG. 24 is a cross-sectional view along a G-G' line in FIG. 23. FIG. 25 is a cross-sectional view along an H-H' line in FIG. 23. Referring to FIG. 23 to FIG. 25, in some embodiments, the second portion P2 and the third portion P3 of the respective scan signal line of the plurality of scan signal lines SSL that cross over the transition area TA and the electrostatic discharge area EPA are in different layers. Optionally, the second portion P2 of the respective scan signal line of the plurality of scan signal lines SSL that cross over the transition area TA and the electrostatic discharge area EPA is in the first signal line layer. In one example, the third portion P3 of the respective scan signal line of the plurality of scan signal lines SSL that cross over the transition area TA and the electrostatic discharge area EPA is in the first conductive layer CT1. In another example, the third portion P3 of the respective scan signal line of the plurality of scan signal lines SSL that cross over the transition area TA and the electrostatic discharge area EPA is in a second conductive layer CT2 on a side of the first conductive layer CT1 away from the base substrate BS, and on a side of the first signal line layer SD1 closer to the base substrate BS.

In some embodiments, second portions of multiple scan signal lines of the plurality of scan signal lines SSL in a same first sub-region of the plurality of first sub-regions SR1 are connected to third portions of the multiple scan signal lines; and the third portions of multiple scan signal lines are alternately in a first conductive layer CT1 and a second conductive layer CT2.

Figure 26:
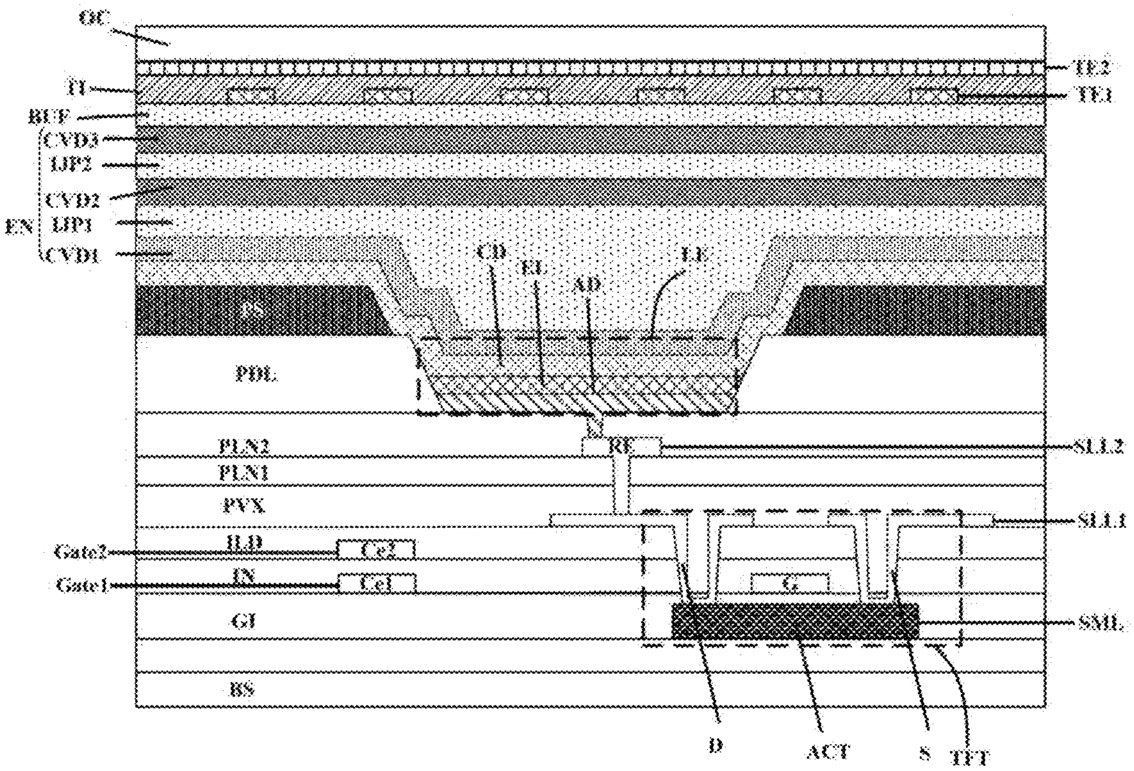
FIG. 26 illustrates a detailed structure in a display area in an array substrate in some embodiments according to the present disclosure.

FIG. 26 illustrates a detailed structure in a display area in an array substrate in some embodiments according to the present disclosure. Referring to FIG. 26, the array substrate in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a relay electrode RE (part of a second SD metal layer) on side of the first planarization layer PLN1 away from the passivation layer PVX; a second planarization layer PLN2 on a side of the relay electrode RE away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The array substrate in the display area further includes an encapsulating layer EN encapsulating the light emitting element LE, and on a side of the cathode layer CD away from the base substrate BS.

The encapsulating layer EN in some embodiments includes a first inorganic encapsulating sub-layer CVD1 on a side of the cathode layer CD away from the base substrate BS, a first organic encapsulating sub-layer IJP1 on a side of the first inorganic encapsulating sub-layer CVD1 away from the base substrate BS, a second inorganic encapsulating sub-layer CVD2 on a side of the first organic encapsulating sub-layer IJP1 away from the base substrate BS, a second organic encapsulating sub-layer IJP2 on a side of the second inorganic encapsulating sub-layer CVD2 away from the base substrate BS, and a third inorganic encapsulating sub-layer CVD3 on a side of the second organic encapsulating sub-layer IJP2 away from the base substrate BS.

The array substrate in the display area further includes a buffer layer BUF on a side of the encapsulating layer EN away from the base substrate BS; a first touch electrode layer TE1 on a side of the buffer layer BUF away from the encapsulating layer EN; a touch insulating layer TI on a side of the first touch electrode layer TE1 away from the buffer layer BUF; a second touch electrode layer TE2 on a side of the touch insulating layer TI away from the buffer layer BUF; and an overcoat layer OC on a side of the second touch electrode layer TE2 away from the touch insulating layer TI.

Referring to FIG. 26, the array substrate includes a semiconductor material layer SML, a first gate metal layer Gate1, a second gate metal layer Gate2, a first signal line layer SLL1, and a second signal line layer SLL2. The array substrate further includes an insulating layer IN between the first gate metal layer Gate1 and the second gate metal layer Gate2; an inter-layer dielectric layer ILD between the second gate metal layer Gate2 and the first signal line layer SLL1; and at least a passivation layer PVX or a planarization layer PLN between the first signal line layer SLL1 and the second signal line layer SLL2.

Figure 27:
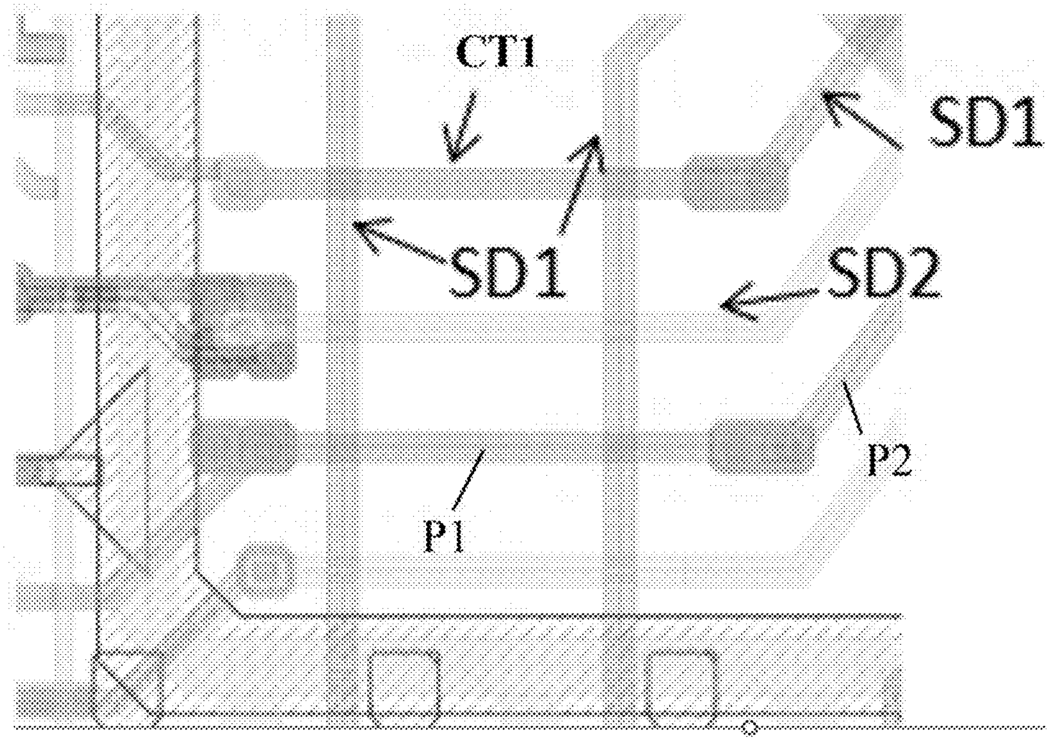
FIG. 27 is a schematic diagram of a layout of signal lines in a portion of an array substrate in some embodiments according to the present disclosure.
Figure 28:
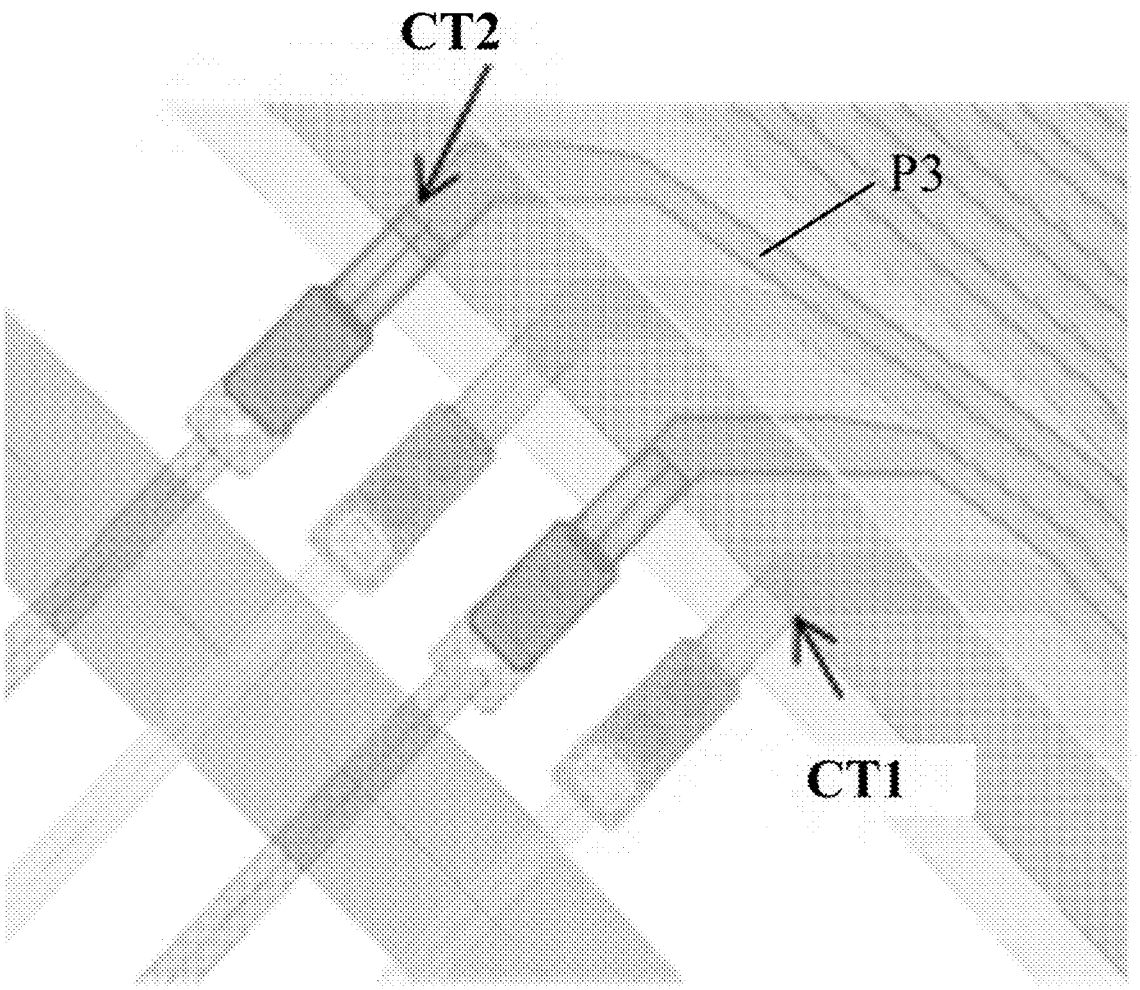
FIG. 28 is a schematic diagram of a layout of signal lines in a portion of an array substrate in some embodiments according to the present disclosure.

FIG. 27 is a schematic diagram of a layout of signal lines in a portion of an array substrate in some embodiments according to the present disclosure. FIG. 28 is a schematic diagram of a layout of signal lines in a portion of an array substrate in some embodiments according to the present disclosure. Referring to FIG. 27 and FIG. 28, in some embodiments, second portions of multiple scan signal lines of the plurality of scan signal lines SSL in a same first sub-region of the plurality of first sub-regions SR1 are alternately in a first signal line layer SD1 and a second signal line layer SD2.

In some embodiments, the second portions of multiple scan signal lines of the plurality of scan signal lines SSL in a same first sub-region of the plurality of first sub-regions SR1 are connected to first portions of the multiple scan signal lines; and the first portions of the multiple scan signal lines are alternately in a first conductive layer CT1 and the second signal line layer SD2. Optionally, an individual second portion in the second signal line layer SD2 is connected to an individual first portion in the second signal line layer SD2. Optionally, an individual second portion in the first signal line layer SD1 is connected to an individual first portion in the first conductive layer CT1.

In some embodiments, the second portions of multiple scan signal lines of the plurality of scan signal lines SSL in a same first sub-region of the plurality of first sub-regions SR1 are connected to third portions of the multiple scan signal lines; and the third portions of the multiple scan signal lines are alternately in a first conductive layer CT1 and a second conductive layer CT2. Optionally, an individual second portion in the second signal line layer SD2 is connected to an individual third portion in the first conductive layer CT1. Optionally, an individual second portion in the first signal line layer SD1 is connected to an individual third portion in the second conductive layer CT2.

Figure 29:
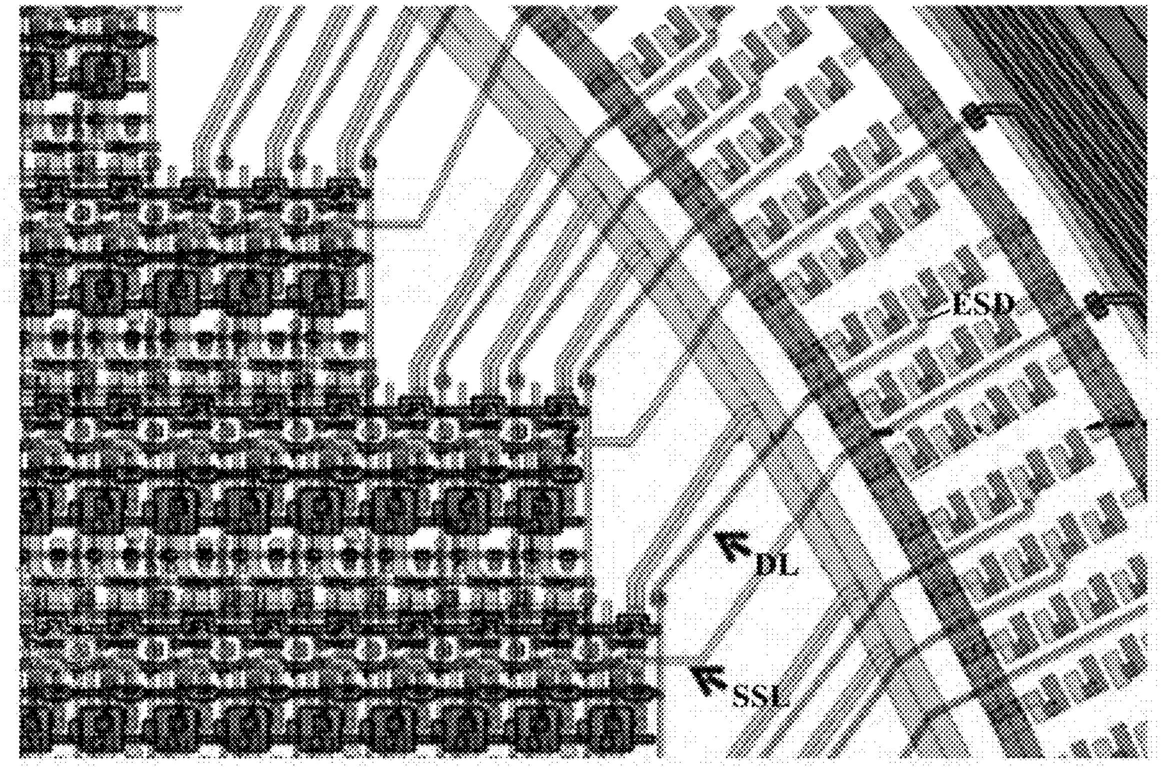
FIG. 29 is a schematic diagram of a layout of signal lines in a portion of an array substrate in some embodiments according to the present disclosure.
Figure 30:
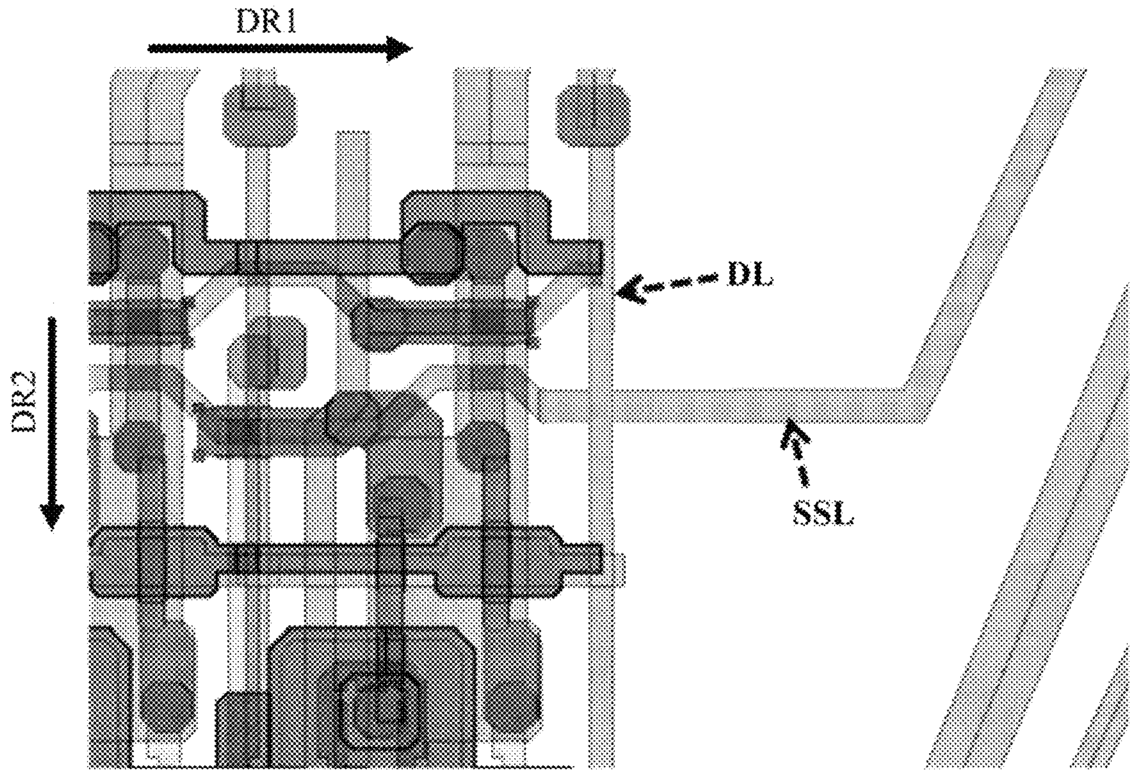
FIG. 30 is a schematic diagram of a layout of signal lines in a portion of an array substrate in some embodiments according to the present disclosure.

The present disclosure applies to array substrates having a single-side driving scan circuit, and also applies to array substrates having a dual-side driving scan circuit. FIG. 29 is a schematic diagram of a layout of signal lines in a portion of an array substrate in some embodiments according to the present disclosure. FIG. 30 is a schematic diagram of a layout of signal lines in a portion of an array substrate in some embodiments according to the present disclosure.

Referring to FIG. 11B, FIG. 29 and FIG. 30, in the transition area TA, at least one data line of a plurality of data lines DL and at least one scan signal line of a plurality of scan signal lines SSL cross over each other. In some embodiments, an individual scan signal line extends from an individual row of subpixels into the transition area TA, crosses over the electrostatic discharge area EPA, and extends into a portion of the notch area NA on a side of the electrostatic discharge area EPA away from the transition area TA. Optionally, the individual scan signal line from the individual row of subpixels crosses over an individual data line in the transition area TA. A portion of the individual scan signal line that crosses over the individual data line extends along a first direction DR1. A portion of the individual data line that crosses over the individual scan signal line extends along a second direction DR2. Optionally, the first direction DR1 and the second direction DR2 are substantially perpendicular to each other.

In some embodiments, a portion of the individual scan signal line that crosses over the electrostatic discharge area EPA is between two adjacent rows of electrostatic discharge units in the electrostatic discharge area EPA, as depicted in FIG. 29.

In some embodiments, the portion of the individual scan signal line that crosses over the individual data line is in a first signal line layer. In some embodiments, the portion of the individual data line that crosses over the individual scan signal line is in a second signal line layer.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a display area and a notch area;

- wherein the display area comprises a first display sub-area and a second display sub-area spaced apart from each other by the notch area;
- wherein the notch area comprises an electrostatic discharge area;
- wherein the array substrate comprises a plurality of data lines and a plurality of scan signal lines;
- the plurality of data lines at least partially extend into the electrostatic discharge area; and
- the plurality of scan signal lines cross over the electrostatic discharge area;
- wherein at least a portion of the electrostatic discharge area comprises a plurality of first sub-regions and a plurality of second sub-regions alternately arranged;
- the plurality of scan signal lines are present in the plurality of first sub-regions, and absent in the plurality of second sub-regions; and
- the plurality of data lines are present in the plurality of second sub-regions, and absent in the plurality of first sub-regions.

2. The array substrate of claim 1, wherein scan signal lines, which extend from the first display sub-area and cross over a portion of the electrostatic discharge area adjacent to the first display sub-area, are connected with scan signal lines, which extend from the second display sub-area and cross over a portion of the electrostatic discharge area adjacent to the second display sub-area.

3. The array substrate of claim 1, wherein a respective first sub-region of the plurality of first sub-regions comprises multiple scan signal lines of the plurality of scan signal lines; and

- a respective second sub-region of the plurality of second sub-regions comprises at least one data line.

4. The array substrate of claim 1, wherein the electrostatic discharge area comprises a plurality of electrostatic discharge units for protecting a plurality of data lines.

5. The array substrate of claim 4, wherein the electrostatic discharge area further comprises a plurality of dummy electrostatic discharge units;

- the plurality of electrostatic discharge units are present in the plurality of second sub-regions, and absent in the plurality of first sub-regions; and
- the plurality of dummy electrostatic discharge units are present in the plurality of first sub-regions, and absent in the plurality of second sub-regions.

6. The array substrate of claim 5, wherein an orthographic projection of an individual scan signal line of the plurality of scan signal lines in an individual first sub-region of the plurality of first sub-regions on a base substrate partially overlaps with an orthographic projection of multiple dummy electrostatic discharge units of the plurality of dummy electrostatic discharge units on the base substrate.

7. The array substrate of claim 1, wherein the notch area further comprises a transition area between the electrostatic discharge area and the first display sub-area or between the electrostatic discharge area and the second display sub-area;

- the transition area is absent of electrostatic discharge units;
- in the transition area, the plurality of data lines and the plurality of scan signal lines cross over each other;
- portions of the plurality of scan signal lines that cross over the plurality of data lines respectively extend along a first direction;
- portions of the plurality of data lines that cross over the plurality of scan signal lines respectively extend along a second direction; and
- the first direction and the second direction are substantially perpendicular to each other.

8. The array substrate of claim 7, wherein multiple scan signal lines from a same row of subpixels cross over a same number of data lines.

9. The array substrate of claim 7, wherein the portions of the plurality of data lines that cross over the plurality of scan signal lines are in a first signal line layer; and

- the portions of the plurality of scan signal lines that cross over the plurality of data lines are in a second signal line layer on side of the first signal line layer away from a base substrate.

10. The array substrate of claim 1, wherein a respective scan signal line of the plurality of scan signal lines that cross over a transition area and the electrostatic discharge area includes a first portion, a second portion, and a third portion;

- the first portion crosses over one or more data lines in the transition area;
- the second portion crosses over the electrostatic discharge area;
- the third portion is at least partially in a portion of the notch area on a side of the electrostatic discharge area away from the transition area; and
- the second portion connects the first portion with the third portion.

11. The array substrate of claim 10, wherein the first portion is in a layer different from the second portion.

12. The array substrate of claim 10, wherein the first portion is in a first conductive layer; and the second portion is in a first signal line layer on a side of the first conductive layer away from a base substrate.

13. The array substrate of claim 10, wherein the respective scan signal line of the plurality of scan signal lines that cross over the transition area and the electrostatic discharge area further comprises a fourth portion at least partially in the display area;

the first portion connects the fourth portion with the second portion;

the first portion is in a first conductive layer; and the fourth portion is in a first signal line layer on a side of the first conductive layer away from a base substrate.

14. The array substrate of claim 13, wherein the second portion and the fourth portion are in a same layer as the plurality of data lines.

15. The array substrate of claim 10, wherein the second portion and the third portion of the respective scan signal line of the plurality of scan signal lines that cross over the transition area and the electrostatic discharge area are in different layers.

16. The array substrate of claim 10, wherein second portions of multiple scan signal lines of the plurality of scan signal lines in a same first sub-region of the plurality of first sub-regions are connected to third portions of the multiple scan signal lines;

the second portions of the multiple scan signal lines are in a first conductive layer; and the third portions of the multiple scan signal lines are alternately in the first conductive layer and a second conductive layer, the second conductive layer being on a side of the first conductive layer away from a base substrate.

17. The array substrate of claim 10, wherein second portions of multiple scan signal lines of the plurality of scan signal lines in a same first sub-region of the plurality of first sub-regions are connected to first portions of the multiple scan signal lines; and the first portions of the multiple scan signal lines are alternately in a first conductive layer and a second signal line layer, the second signal line layer being on a side of the first conductive layer away from a base substrate.

18. The array substrate of claim 17, wherein an individual second portion in the second signal line layer is connected to an individual first portion in the second signal line layer; and an individual second portion in the first signal line layer is connected to an individual first portion in the first conductive layer.

19. The array substrate of claim 18, wherein second portions of multiple scan signal lines of the plurality of scan signal lines in a same first sub-region of the plurality of first sub-regions are connected to third portions of the multiple scan signal lines;

the third portions of the multiple scan signal lines are alternately in the first conductive layer and a second conductive layer, the second conductive layer being on a side of the first conductive layer away from a base substrate;

an individual second portion in the second signal line layer is connected to an individual third portion in the first conductive layer; and an individual second portion in the first signal line layer is connected to an individual third portion in the second conductive layer.

20. A display apparatus, comprising the array substrate of claim 1, and one or more integrated circuits connected to the array substrate.

* * * * *